(12) United States Patent
Busardo et al.

(10) Patent No.: US 10,982,312 B2
(45) Date of Patent: *Apr. 20, 2021

(54) SINGLE- AND/OR MULTI-CHARGED GAS ION BEAM TREATMENT METHOD FOR PRODUCING AN ANTI-GLARE SAPPHIRE MATERIAL

(71) Applicant: IONICS FRANCE, Hérouville-Saint-Clair (FR)

(72) Inventors: Denis Busardo, Gonneville-sur-Mer (FR); Frederic Guernalec, Liffre (FR)

(73) Assignee: IONICS FRANCE, Hérouville-Saint-Clair (FR)

( * ) Notice: Subject to any disclaimer, the term of this patent is extended or adjusted under 35 U.S.C. 154(b) by 381 days.

This patent is subject to a terminal disclaimer.

(21) Appl. No.: 15/312,572

(22) PCT Filed: Mar. 23, 2015

(86) PCT No.: PCT/EP2015/056116
§ 371 (c)(1),
(2) Date: Nov. 18, 2016

(87) PCT Pub. No.: WO2015/176850
PCT Pub. Date: Nov. 26, 2015

(65) Prior Publication Data
US 2017/0107641 A1   Apr. 20, 2017

(30) Foreign Application Priority Data

May 23, 2014   (FR) .................................. 1401172
Oct. 9, 2014   (FR) .................................. 1402293

(51) Int. Cl.
*C23C 14/48*   (2006.01)
*C23C 14/00*   (2006.01)
(Continued)

(52) U.S. Cl.
CPC .......... *C23C 14/0015* (2013.01); *C01F 7/021* (2013.01); *C23C 14/48* (2013.01);
(Continued)

(58) Field of Classification Search
CPC ... C23C 14/0015; C23C 14/018; C23C 14/48; C23C 14/5833; C01F 7/021; C30B 29/20;
(Continued)

(56) References Cited

U.S. PATENT DOCUMENTS 8,778,463 B2 *   7/2014   Park ........................ C30B 29/20
                                                         204/192.26
8,852,695 B2 * 10/2014   Huang ............... G02B 6/03666
                                                         427/523
(Continued)

FOREIGN PATENT DOCUMENTS

EP   2752507 A1   7/2014
FR   2899242 A1   10/2007
WO   WO 2014126551 A1 *   8/2014   ............ H01J 37/317

OTHER PUBLICATIONS

Allen Kirkpatrick et al.; "Effect of ion implantation on the strength of sapphire at 300-600° C."; Journal of Materials Science; vol. 36; 2001 (no month); pp. 2195-2201.*
(Continued)

*Primary Examiner* — Marianne L Padgett
(74) *Attorney, Agent, or Firm* — Marshall, Gerstein & Borun LLP

(57) ABSTRACT

A treatment method of a sapphire material, said method comprising bombardment of a surface of the sapphire material, said surface facing a medium different from the sapphire material, by a single- and/or multi-charged gas ion beam so as to produce an ion implanted layer in the sapphire material, wherein the ions are selected from ions of the elements from the list consisting of helium (He), neon (Ne),
(Continued)

argon (Ar), krypton (Kr), xenon (Xe), boron (B), carbon (C), nitrogen (N), oxygen (O), fluorine (F), silicon (Si), phosphorus (P) and sulphur (S). Use of said method to obtain a capacitive touch panel having a high transmission in the visible range.

10 Claims, 20 Drawing Sheets

(51) Int. Cl.
| | |
|---|---|
| C30B 33/04 | (2006.01) |
| G02B 1/12 | (2006.01) |
| G02B 1/113 | (2015.01) |
| G06F 3/044 | (2006.01) |
| C30B 29/20 | (2006.01) |
| G02B 1/11 | (2015.01) |
| G02B 1/02 | (2006.01) |
| C01F 7/02 | (2006.01) |
| C23C 14/58 | (2006.01) |

(52) U.S. Cl.
CPC .............. *C30B 29/20* (2013.01); *C30B 33/04* (2013.01); *G02B 1/02* (2013.01); *G02B 1/11* (2013.01); *G02B 1/113* (2013.01); *G02B 1/12* (2013.01); *G06F 3/0446* (2019.05); *C23C 14/5833* (2013.01); *G06F 2203/04103* (2013.01)

(58) Field of Classification Search
CPC .. C30B 33/04; G02B 1/02; G02B 1/11; G02B 1/113; G02B 1/12; G06F 2203/04103
USPC ....... 427/527, 529, 530, 163.1, 163.3, 163.4
See application file for complete search history.

(56) References Cited

U.S. PATENT DOCUMENTS

| | | | | |
|---|---|---|---|---|
| 9,092,187 | B2* | 7/2015 | Kwong | G06F 1/1601 |
| 9,416,442 | B2* | 8/2016 | Memering | C23C 14/48 |
| 9,623,628 | B2* | 4/2017 | Kwong | C30B 29/20 |
| 9,828,668 | B2* | 11/2017 | Memering | C30B 31/22 |
| 9,981,249 | B2* | 5/2018 | Busardo | B01J 23/10 |
| 10,196,731 | B2* | 2/2019 | Guernalec | G02B 1/12 |
| 10,280,504 | B2* | 5/2019 | Rogers | C23C 14/48 |
| 10,648,068 | B2* | 5/2020 | Vuille | H01J 37/32678 |
| 10,703,674 | B2* | 7/2020 | Navet | C23C 23/0055 |
| 10,737,242 | B2* | 8/2020 | Busardo | C01G 25/006 |
| 2006/0210783 | A1* | 9/2006 | Seder | C03C 17/225 |
| | | | | 428/212 |
| 2009/0212238 | A1* | 8/2009 | Guernalec | C23C 14/48 |
| | | | | 250/492.3 |
| 2013/0328798 | A1* | 12/2013 | Chen | H01H 1/027 |
| | | | | 345/173 |
| 2014/0070119 | A1* | 3/2014 | Huang | G02B 6/03666 |
| | | | | 250/515.1 |
| 2014/0192467 | A1* | 7/2014 | Kwong | G06F 1/1601 |
| | | | | 361/679.3 |
| 2014/0248472 | A1* | 9/2014 | Memering | C23C 14/48 |
| | | | | 428/192 |
| 2014/0272298 | A1* | 9/2014 | Memering | C23C 28/04 |
| | | | | 428/142 |
| 2017/0334775 | A1* | 11/2017 | Navet | C23C 14/48 |
| 2019/0092683 | A1* | 3/2019 | Navet | C03C 23/0055 |
| 2019/0119154 | A1* | 4/2019 | Navet | C03C 23/0055 |
| 2019/0119155 | A1* | 4/2019 | Navet | C03C 3/087 |
| 2019/0161403 | A1* | 5/2019 | Navet | C03C 4/02 |
| 2019/0161404 | A1* | 5/2019 | Navet | C03C 23/0055 |
| 2019/0352763 | A1* | 11/2019 | Vuille | C23C 14/48 |
| 2019/0352770 | A1* | 11/2019 | Busardo | C23C 14/081 |
| 2020/0043694 | A1* | 2/2020 | Busardo | C23C 14/0015 |
| 2020/0325067 | A1* | 10/2020 | Navet | C03C 3/097 |

OTHER PUBLICATIONS

C. Chaiwong et al.; "Optical property modification of Ruby and Sapphire by N-ion implantation"; Surface & Coating Technology; vol. 196; 2005 (no month), or available online Sep. 22, 2004; pp. 108-112.*

William T Spratt et al.; "Formation of optical barriers with excellent thermal stability in single-crystal sapphire by hydrogen ion implantation and thermal annealing"; Applied Physical Letters, vol. 99; Sep. 16, 2011; 111909-1 to 111909-3.*

William Spratt et al.; "Optical mode confinement and selection in single-crystal sapphire fibers by formation of nanometers scale cavities with hydrogen ion implantation"; Journal of Applied Physics; vol. 114; Nov. 22, 2013; 203501(p. 1-7).*

Robert C. Weast, PhD, editor; CRC Handbook of Chemistry and Physics, 56th edition; CRC press, 18901 Cranwood Pkwy., Cleveland, OH 44128; 1975 (no month), excerpt p. E-224.*

Chaiwong et al., Optical property modification of ruby and sapphire by N-ion implantation, Surface and Coatings Technology, 196(1-3):108-12 (Jun. 2005).

International Application No. PCT/EP2015/056116, International Preliminary Report on Patentability, dated Nov. 29, 2016.

International Application No. PCT/EP2015/056116, International Search Report and Written Opinion, dated Jun. 24, 2015.

Kirkpatrick et al., Effect of ion implantation on the strength of sapphire at 300-600° C., J. Materials Sci., 36(9): (May 2001), p. 2195-2201.

Spratt et al., Effects of hydrogen ion implantation and thermal annealing on structural and optical properties of single-crystal sapphire, Materials Research Society Symposium Proceedings—Ion Beams—New Applications from Mesoscale to Nanoscale 2012 Materials Research Society, USA, vol. 1354, pp. 97-102 (Apr. 2011).

* cited by examiner

SINGLE- AND/OR MULTI-CHARGED GAS ION BEAM TREATMENT METHOD FOR PRODUCING AN ANTI-GLARE SAPPHIRE MATERIAL

CROSS-REFERENCE TO RELATED APPLICATIONS

This application is the U.S. National Phase of International Patent Application No. PCT/EP2015/056116 filed Mar. 23, 2015, which claims the benefit of French Patent Application No. 1402293 filed Oct. 9, 2014 and French Patent Application No. 1401172 filed May 23, 2014, the respective disclosures of which are each incorporated herein by reference in their entireties.

FIELD OF THE DISCLOSURE

The invention relates to a method for treating a sapphire material by a single- and/or multi-charged gas ion beam; this method is intended to reduce reflection and enhance light transmission, for example in the spectrum of wavelengths of the visible range, for example in long term use. The present invention also relates to a capacitive touch panel having a high transmission in the visible range.

According to the present invention, a "sapphire material" is a material substantially consisting of corundum, i.e. of aluminium oxide ($\alpha$-$Al_2O_3$). A sapphire material may comprise trace amounts of elements such as iron, titanium, chromium, copper, or magnesium that can give corundum respectively blue, yellow, purple, orange, or green colour. Chromium impurities in corundum yield pink or red tint, the latter being usually called "ruby"; rubies are part of sapphire materials according to wording of the present invention. The colour is due to the appearance of energy levels within the corundum band gap, due to the presence of impurities. These levels modify the emission and absorption spectra of the material and thus the colour thereof. Other trace elements may also be part of a sapphire material.

A sapphire material comprises at least 98 weight % of aluminium oxide, as for example at least 99 weight % of aluminium oxide, as for example at least 99.9 weight % of aluminium oxide.

A sapphire material can be made of one or of a plurality of corundum single-crystal(s); it can thus be polycrystalline; according to an embodiment of the present invention, a sapphire material is one corundum single-crystal part.

A sapphire material can be natural or synthetic; according to an embodiment, a sapphire material of the present invention is a synthetic sapphire material.

BACKGROUND

Since the early 19th Century, it has been known how to manufacture synthetic sapphires (and synthetic rubies) in the laboratory, the chemical composition and physical properties whereof are the same as those of natural gems. It may be possible to detect these synthetic gems by the generally curved crystallisation lines thereof, at least for the oldest productions.

Synthetic sapphire material production is currently at the industrial stage. A synthetic sapphire material can be for example produced by a Czochralski process or by methods deriving from the Czochralski process (such for example Kyropolis method, Bagdasarov method, Stepanov method, EFG (Edge defined Film fed Growth) process); a synthetic sapphire material can also be produced from agglomerated aluminium oxide, sintered and fused (such as by hot isostatic pressing) in an inert atmosphere, yielding a transparent but slightly porous polycrystalline product.

Sapphire materials are also known as "Blue Glass" or "sapphire glass" even though they are not glasses as such, but crystalline material.

In physical terms, synthetic sapphire material is a very hard crystalline material (hardness equal to 9 on the Mohs scale) belonging to the corundum family, having a very high refractive index equal to 1.76.

Sapphires may be heat-treated; gems which are too light, too dark or with high inclusion content may be heated. This process makes it possible to increase the colour and clarity while dissolving the elements present in trace form in the gem.

Since the early 19$^{th}$ Century, it has been known how to manufacture synthetic sapphires and synthetic rubies in the laboratory, the chemical composition and physical properties whereof are the same as those of natural gems. However, it is possible to detect these synthetic gems by the generally curved crystallisation lines thereof, at least for the oldest productions.

For the high scratch resistance property thereof, synthetic sapphire material is used in a wide range of applications, such as screens, for example touch screens, windows, watch glasses, light emitting device (LED) parts, lighting device parts, optical components, such as for example device lenses or camera lenses. Using synthetic sapphire materials in the field of smart phones may be particularly relevant.

It is well known that a synthetic sapphire material surface reflects approximately 15.5% of incident light. Such a high light reflection may be a drawback when one wants to read information behind a sapphire material window; it may actually reduce the reading ability of for example a watch or a flat screen for a computer or a mobile phone.

This light reflection on a synthetic sapphire material surface is more generally explained by Fresnel equations giving for a light ray passing through an interface at an angle of incidence of 90°, the following coefficients of reflection (R) and transmission (T):

$$R=((nS-nM)/(nS+nM))^2;$$

$$T=4 \times nM \times nS/(nS+nM)^2.$$

Coefficient of reflection (R) is also usually called "power reflexion coefficient" or "reflectance";

Coefficient of transmission (T) is also usually called "power transmission coefficient" or "transmittance".

nS and nM are the refractive indexes in the visible light range (wavelength value comprised between 400 and 800 nm) of respectively the sapphire material and of the medium joining the sapphire material and separated from it by an interface.

It is noted that R+T=1 (energy conservation).

As for an example, one can calculate R and T for an air/sapphire material configuration, where nM=1 for air (where nM=nA, air refractive index) and nS=1.76 for an example of synthetic sapphire material; here above formula give following results:

$$R=0.0758 \text{ and } T=1-R=0.9242;$$

Thus 7.6% of the light is reflected whereas 92.4% of the light is transmitted due to the refractive index difference between said sapphire material and air. This light reflection level may be considered as high and be a drawback for several uses.

This drawback is even more important when considering a sapphire material surrounded by two air layers, thus having two air/sapphire material interfaces. For such a synthetic sapphire material strip consisting of two sides, the reflection loss is two times greater, i.e. 2×7.6%=15.2%. This high reflection results in difficulty reading data situated under a sapphire material screen or watch glass.

Anti-glare methods are known from the prior art and consist of metal oxide-based depositions which are relatively complex and costly to use. For example for watch glasses, mention may be made of the method consisting of vacuum deposition ($10^{-5}$ torr) of thin layers of metal oxides with a precision in the region of one Angstrom. In dust-free enclosures, the watch glasses are first cleaned in washing lines and undergo ultrasonic drying. They are mounted in holders entering the treatment bell chambers. A vacuum is produced in the bell chambers to obtain evaporation (sublimation) of the oxide at a lower temperature. The evaporation may be performed by means of a Joule effect by heating the oxide or using an electron gun. It is necessary to have perfect control of the vacuum quality and measurement, the evaporation rate and the deposited layer thicknesses. These thicknesses should obviously be uniform. Other types of less costly PVD (physical Vapor Deposition) coatings exist such as magnesium fluoride $MgF_2$ (index 1.38) and cryolite $Na_3AlF_6$ (index 1.35) wherein the refractive indexes approach the ideal index (equal to 1.33) without however attaining the scratch resistance properties comparable or superior to those of synthetic sapphire material as enabled by the method according to the invention. PVD coatings deposited on synthetic sapphire material in the aim of giving said sapphire material anti-glare properties are liable to scratch or chip, thus removing any interest initially Nevertheless, PVD coating methods have drawbacks; PVD coating method consists in making several thin layers with thickness and chemical composition which have to be perfectly controlled to form each stack of interferential layers having a very precise refractive index. Difficulties may raise when using such a method; namely it may be difficult to provide relevant and/or reproducible results; those difficulties can result from thickness control problems, refractive index control problems, shape and location of a part in a vacuum chamber, gas type changing, metal type changing before making each layer, residual contamination layer after each gas and/or metal changing, treatment parameters validation before treatment of new parts.

SUMMARY

All of the above gives rise to a need for a sapphire material treatment method to give enhanced anti-glare properties. Preferably, anti-glare properties obtained thanks to such a method should be stable over a very long term; preferably, said anti-glare properties should have good scratch-proof properties, that are for example substantially comparable or superior to those of the original synthetic sapphire material. Accordingly, said sapphire material surface treatment method may substitute anti-glare PVD coatings and even tough may lead to enhanced anti-glare results. Preferably said sapphire material surface treatment method should be suitable for easy industrialisation, so as to be able to offer such sapphire materials in a significant quantity and at reasonable costs.

The aim of the invention is that of offering a method for treating sapphire material that is open new routes; preferably, said method is not expensive or even though inexpensive and suitable for treating surfaces meeting the needs of numerous applications.

For this purpose, an object of the invention is a treatment method of a sapphire material, said method comprising bombardment of a surface of the sapphire material, said surface facing a medium different from the sapphire material, by a single- and/or multi-charged gas ion beam so as to produce an ion implanted layer in the sapphire material, wherein:
  the dose of implanted single- and/or multi-charged gas ions per unit of surface area is chosen in a range between $10^{12}$ ions/cm$^2$ and $10^{18}$ ions/cm$^2$; and,
  the acceleration voltage is chosen in a range between 5 kV and 1000 kV;
  the dose of implanted single- and/or multi-charged gas ions and the acceleration voltage are further chosen so that to obtain an anti-glare treatment in the visible range; and,
  wherein the ions of the single- and/or multi-charged gas ions are selected from ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S).

Thanks to said treatment method one can achieve an anti-glare treatment of a sapphire material; such an anti-glare treatment may result in excellent transmission results, namely in the visible range. According to embodiments, transmission results that have never been reached before can be achieved.

Thanks to said treatment method one can treat sapphire material surfaces meeting the needs of numerous applications. Of these applications, mention may be made of: touch screens, windows, watch glasses, light emitting device (LED) parts, lighting device parts, optical components, such as for example device lenses.

New applications of sapphire material may also be developed thanks to the treatment method of the invention.

Furthermore, the treatment method of the invention may be implemented thanks to cost effective devices. It can also be implemented so as to obtain high productivity levels.

The present invention thus opens new routes for treatment and uses of sapphire materials.

According to different embodiments of the present invention, that may be combined according to all technically valuable embodiments:
  the ions of the single- and/or multi-charged gas ions are selected from ions of the elements from the list consisting of helium (He), neon (Ne), argon (Ar), krypton (Kr), xenon (Xe), nitrogen (N) and oxygen (O), for example from the list consisting of nitrogen (N) and oxygen (O);
  the ions for bombardment by a single- and/or multi-charged gas ion beam are produced by an electron cyclotron resonance (ECR) source;
  further features are fulfilled, wherein:
    the dose of implanted single- and/or multi-charged gas ions per unit of surface area is chosen so as to obtain an atomic concentration of ions in the implanted layer such that the refractive index nL of the implanted layer is approximately equal to $(nA \times nS)^{1/2}$, for example is greater or equal to $0.8 \times (nA \times nS)^{1/2}$ and equal or less to $1.2 \times (nA \times nS)^{1/2}$, where nA is the refractive index of air and nS the refractive index of sapphire material;

the acceleration voltage is chosen so as to obtain an implanted layer thickness, e, which is greater or equal to) 0.75 p$\lambda$/(4 nL) and equal or less to 1.25 p$\lambda$/(4 nL), for example equal to p$\lambda$/(4 nL), where:
  e is the implanted layer thickness corresponding to an implantation zone where the atomic concentration of implanted single- and/or multi-charged gas ions is greater than or equal to 1% and wherein e is expressed in nanometer;
  p is a non nil positive integer;
  $\lambda$ is the incident wavelength, wherein $\lambda$ is expressed in nanometer, for example $\lambda$ is equal to 560 nm; and,
  nL is the index of the ion implanted layer, for example nL is equal to 1.4;
the ions of the gas beam are single- and multi-charged and comprises 10% multi-charged ions or more than 10% multi-charged ions;
the acceleration voltage is chosen to obtain an implanted layer thickness comprised between 75 p and 125 p, for example equal to 100 p, expressed in nm, where p is a non nil positive integer;
the dose of implanted single- and/or multi-charged gas ions per unit of surface area is chosen to obtain an atomic concentration of implanted ions greater or equal to 5% and equal or less than 20%, as for example greater or equal to 9.5% and equal or less than 10.5%;
the sapphire material is movable in relation to the single- and/and multi-charged gas ion beam at a speed, VD, between 0.1 mm/s and 1000 mm/s; according to an embodiment, the same zone of sapphire material is moved under the single- and/or multi-charged gas ion beam along a plurality, NP, of passes at the speed VD;
the dose of implanted single- and/or multi-charged gas ions per unit of surface area is chosen in a range between $10^{16}$ ions/cm$^2$ and $10^{18}$ ions/cm$^2$, for example is chosen in a range between $2\times10^{16}$ ions/cm$^2$ and $2\times10^{17}$ ions/cm$^2$;
the acceleration voltage is chosen in a range between 10 kV and 100 kV;
the dose of implanted single- and/or multi-charged gas ions and the acceleration voltage are further chosen according to additional choice rules; according to different embodiments:
  the additional choice rules comprise using data gathered in a step prior to bombardment by a single- and/or multi-charged gas ion beam of the sapphire material to be treated, wherein
    said step consists in choosing one type of single- and/or multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), performing a plurality of experiments with sapphire materials similar to the one to be treated by using said ions to be bombarded and varying the implanted single- and/or multi-charged gas ion dose per unit of surface area and the acceleration voltage until determining desired implanted single- and/or multi-charged gas ion dose per unit of surface area ranges and acceleration voltage ranges so as to produce an ion implanted layer to obtain a desired anti-glare treatment in the visible range;
    choosing a single- and/or multi-charged gas ion dose per unit of surface area and an acceleration voltage value within the ranges of the preceding step and treating the sapphire material to be treated with said ions said values
  the additional choice rules comprise:
    choosing one type of single- and/or multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S);
    choosing a single- and/or multi-charged gas ion dose per unit of surface area and an acceleration voltage value according to a calculation based on an ion implantation profile according to the implantation depth for the chosen ions, where said ion implantation profile has been previously be calculated or determined for a plurality of acceleration voltages so as to produce an ion implanted layer to obtain a desired anti-glare treatment in the visible range, so as to obtain an atomic concentration of implanted ions greater or equal to 5% and equal or less than 20%, as for example greater or equal to 9.5% and equal or less than 10.5%;
  the additional choice rules comprise:
    choosing one type of single- and/or multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S);
    choosing a single- and/or multi-charged gas ion dose per unit of surface area and an acceleration voltage value according to following equation:

$$0.02 \leq DC^2/(T\Delta n) \leq 2; \text{ wherein:}$$

D is a single- and/or multi-charged gas ion dose per unit of surface area value to be chosen, expressed in $10^{16}$ ions/cm$^2$;
    C=M/15, where M is the atomic mass the chosen ion.
    T is an acceleration voltage to be chosen, expressed in kV;
    $\Delta n$ is the refractive index difference between the refractive index, nS, of the sapphire material to be treated and the refractive index, nM, of the medium facing the surface to be ion bombarded of the sapphire material; according to an embodiment, $DC^2/(T\Delta n)$ is greater or equal to 0.1, as for example greater or equal to 0.5, and/or equal or less than 1, as for example equal or less than 0.8;

The present invention is also directed to a part made of synthetic sapphire material comprising at least one surface with implanted ions according to any of preceding claims, wherein the reflection of an incident wave in the visible range is reduced at least by one third, as for example by one half, when compared to the reflection of an incident wave in the visible range on the untreated sapphire material, such as for example a wavelength of the incident wave of 560 nm.

The present invention is also directed to the use of the treatment method according to any embodiment of preceding method, for treating a solid part made of synthetic sapphire material chosen from the list consisting of a screen, such as for example a touch screen, a window, a watch glass, a light emitting device (LED) part, a lighting device part, an optical component, such as for example device lens.

The present invention is also directed to a synthetic sapphire material comprising at least one surface with implanted ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), wherein the reflection of an incident wave in the visible range on said surface is equal or less to 2%, as for example equal or less to 1%, when measured at a 560 nm wavelength.

The present invention is also directed to a capacitive touch panel having a high transmission in the visible range comprising:
 a) a front face made of a sapphire material where the front side of the sapphire material has been ion bombarded by using an ion beam wherein the ions are chosen from the ions of the atoms from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S);
 b) a capacitive touch detection layer,
 c) a display screen.

According to an embodiment of the said capacitive touch panel, the front side of the sapphire material has a thickness equal to or less than 1 mm.

According to an embodiment of the said capacitive touch panel, the capacitive touch panel further comprising a rear face facing display screen and made of sapphire material where the rear face of sapphire material has been ion bombarded by using an ion beam wherein the ions are chosen from the ions of the atoms from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S).

According to an embodiment of the said capacitive touch panel, the rear face of sapphire material has a thickness less than or equal to 400 μm, for example equal to 100 μm.

According to an embodiment of the said capacitive touch panel, the front face, the capacitive detection layer and the rear face are jointly assembled and separated from the display screen by an air layer.

According to an embodiment of the said capacitive touch panel, at least a lateral side of at least one face made of sapphire material has been ion bombarded by using an ion beam wherein the ions are chosen from the ions of the atoms from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S).

According to an embodiment of the said capacitive touch panel, the light transmission of the light emitted by the display screen, as for example measured at a 560 nm wavelength, is greater than or equal to 90%, for example equal or greater to 97%, even more equal or greater to 98%.

According to embodiments of the present invention, the present invention also relates to:
 a long-term anti-glare treatment method in the visible range of a synthetic sapphire material which consists of bombardment by a single or multi-charged gas ion beam produced by an electron cyclotron resonance (ECR) source where:
  the dose of implanted single- and multi-charged gas ions per unit of surface area is chosen in a range between $10^{12}$ ions/cm$^2$ and $10^{18}$ ions/cm$^2$ so as to obtain an atomic concentration of gas ions such that the refractive index nL of the implanted layer is approximately equal to $(nA \times nS)^{1/2}$ where nA is the index of air and nS the index of synthetic sapphire material;
  the acceleration voltage is chosen in a range between 5 kV and 1000 kV so as to obtain an implanted thickness e equal to Lpλ/4 nL where e is the implanted thickness corresponding to an implantation zone where the atomic concentration of implanted single- and multi-charged gas ions is greater than or equal to 1%, where p is an integer, λ the incident wavelength and nL the index of the implanted layer;
 in said method, the single- and multi-charged gas ions of the ion beam may be selected from the ions of the elements from the list consisting of helium (He), neon (Ne), argon (Ar), krypton (Kr), xenon (Xe);
 in said method, the single- and multi-charge gas ions of the ion beam may be selected from the ions of the gases from the list consisting of nitrogen (N$_2$) and oxygen (O$_2$);
 in said method, the single- and multi-charged gas ion beam comprises 10% multi-charged ions or more than 10% multi-charged ions;
 in said method, the acceleration voltage is chosen to obtain an implanted thickness equal to 100 p nm where p is an integer
 in said method, the dose of implanted single- or multi-charged gas ions per unit of surface area may be chosen to obtain an atomic concentration of implanted ions equal to 10% with an uncertainty of (+/−) 5%;
 in said method, the choice of the implanted single- and multi-charged gas ion dose per unit of surface area and the choice of acceleration voltage may be made by means of a calculation performed previously for evaluating the implanted single- or multi-charged gas ion dose per unit of surface area to obtain an atomic concentration of implanted ions equal to 10% with an uncertainty of (+/−) 5% based on an ion implantation profile chosen according to the implantation depth;
 in said method, the synthetic sapphire material may be movable in relation to the single- and multi-charged gas ion beam at a speed, VD, between 0.1 mm/s and 1000 mm/s;
 in said method, the same zone of synthetic sapphire material may be moved under the single- and multi-charged gas ion beam along a plurality, N, of passes at the speed VD;
 in said method, the same zone of synthetic sapphire material is moved under the single- and multi-charged gas ion beam along a plurality, N, of passes at the speed VD;
 a part obtained thanks to embodiments of said method may be a part made of synthetic sapphire material comprising at least one surface where the reflection of an incident wave in the visible range is reduced at least by one half;
 said method may be used for treating a solid part made of synthetic sapphire material chosen from the list consisting of a touch screen, a watch glass, an optical device lens.

According to embodiments of the present invention, the present invention also relates to:
 a scratch-proof capacitive touch panel having a high transmission in the visible range, characterised in that it comprises:
  a) a "front" face made of sapphire material having a thickness less than or equal to 1 mm for example equal to 400 µm, treated against glare in the visible range, for example equal to 330 µm, on the contact surface side (front side), by ion bombardment using an ion beam wherein the ions are chosen from the ions of the atoms from the list consisting of helium (He), nitrogen (N), oxygen (O), neon (Ne), argon (Ar), krypton (Kr), xenon (Xe);

b) a capacitive touch detection layer comprising electrical tracks, insulating resin;

the electrical tracks of the detection layers of the said capacitive touch panel may be made of ITO (Indium Tin Oxide) material;

the electrical tracks of the capacitive touch detection layer of the said capacitive touch panel may form a lattice wherein the volume may comprise at least 90% void and may be made of metal having an electrical conductivity greater than or equal to pure aluminium, silver nanowires, silver nanoparticles or carbon nanotubes;

the electrical tracks of the capacitive touch detection layer of the said capacitive touch panel may be assembled with an insulating resin wherein the refractive index in the visible range may be greater than or equal to 1.6, for example equal to 1.8;

the said capacitive touch panel may comprise a "rear" face made of sapphire material having a thickness less than or equal to 400 µm, for example equal to 100 µm, treated against glare on the display screen side (back side) by ion bombardment identical to that used for the anti-glare treatment of the contact surface of the "front" face;

the "front" face, the capacitive detection layer and the "rear" face of the said capacitive touch panel may be connected and may be separated from the display screen by an air layer;

the anti-glare treatment in the visible range of a sapphire material of the said capacitive touch panel may consist of single- and multi-charged ion beam bombardment where:

the dose of implanted single- and multi-charged gas ions per unit of surface area is chosen in a range between $10^{16}$ ions/cm$^2$ and $10^{18}$ ions/cm$^2$ so as to obtain an atomic concentration of gas ions such that the refractive index nL of the implanted layer is approximately equal to $(nA \times nS)^{1/2}$ where nA is the index of air and nS the index of sapphire material;

the acceleration voltage is chosen in a range between 10 kV and 100 kV so as to obtain an implanted thickness (e) equal to $p\lambda/4$ nL where e is the implanted thickness corresponding to an implantation zone where the atomic concentration of implanted single- and multi-charged gas ions is greater than or equal to 1%, where p is an integer, A the incident wavelength and nL the index of the implanted layer;

the implanted thickness of the said capacitive touch panel may be equal to 80p nm where p is an integer;

the said single- and multi-charged gas ion beam may be produced by an electron cyclotron resonance (ECR) source;

the sapphire material of the said capacitive touch panel may be treated against glare by moving in relation to the single- and multi-charged gas ion beam at a speed, VD, between 0.1 mm/s and 1000 mm/s;

the same zone of sapphire material of the said capacitive touch panel may be treated against glare by moving under the single- and multi-charged gas ion beam along a plurality, NP, of passes at the speed VD;

at least one sapphire material of the said capacitive touch panel may be treated against glare with an implanted ion and the reflection of an incident wave in the visible may be reduced at least by one half;

at least one sapphire material of the said capacitive touch panel may be treated against glare wherein the implanted thickness may have the chemical formula $Al_2O_{3+X}$ where X is between 0.01 and 0.5 in the implanted thickness;

the light transmission of the said capacitive touch panel may be greater than or equal to 90% for a wavelength of 560 nm, for example equal to 97%.

According to an embodiment of the present invention, the present invention also relates to a large-sized capacitive touch panel consisting of an assembly of elementary capacitive touch panels, where an elementary capacitive touch panel is a scratch-proof capacitive touch panel as here above defined and wherein the "front" face and/or the "rear" face made of sapphire material of each elementary touch panel are treated against glare by ion bombardment on the lateral sides thereof under identical conditions to those used for the anti-glare treatment of the front and/or back sides thereof.

BRIEF DESCRIPTION OF THE DRAWINGS

Examples will now be described with reference to the accompanying drawings wherein.

DETAILED DESCRIPTION

Elements in the figures are illustrated for simplicity and clarity and have not necessarily been drawn to scale. For example, the dimensions of some of the elements in the figure may be exaggerated relative to other elements to help improve the understanding of the embodiments of the present invention.

Nevertheless, transmission diagrams have been drawn to scale. Transmission diagrams illustrate variation of a (or of a plurality of) coefficient of transmission (T) (also usually called "power transmission coefficient" or "transmittance") as a function of light wavelength. The wavelength range comprises the visible wavelength range.

Transmission diagrams result from measurements made with a spectrophotometer where an incident light beam passes through two main faces of a sample and where the light transmission through the said sample is measured at a plurality of wavelengths. Said two main faces are usually parallel faces.

Transmission diagrams of sapphire material samples treated by the method of the present invention have been measured with a UV-5200 UV/VIS Spectrophotometer commercialized by METASH Company. In those measurements, the medium facing (and contacting) each of the main faces of the sapphire material samples is air.

Figure 1:
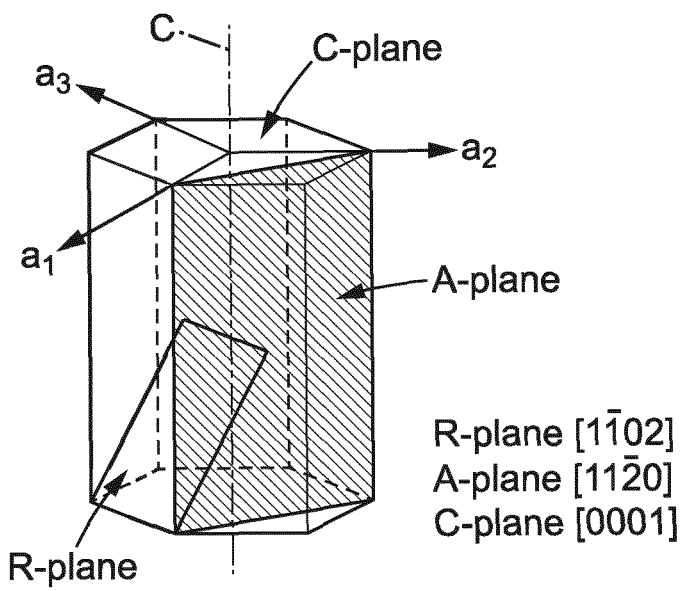
FIG. 1 is a sketch of a sapphire material crystal.

FIG. 1 is a sketch of a sapphire material single-crystal where one can distinguish the crystallographic main features of such a crystal; the sapphire (corundum) single-crystal structure can be represented by ordering octahedron where $O^{2-}$ ions are in tops (peaks) of the octahedrons and $Al^{3+}$ ions are inside of the octahedrons. FIG. 1 shows the structure of the primary planes of the sapphire crystal corresponding to the structure system of sapphire. Shown in this figure are the following planes: C-plane is (0001); A-plane is (1120) and R-plane is (1012). Planes nomenclature corresponds to usual crystallographic nomenclature.

As here above mentioned each face of an untreated sapphire material sample reflects approximately 7.75% of incident light; thus the transmission of an untreated sapphire material sample is approximately 84.5% in the visible range.

Figure 2:
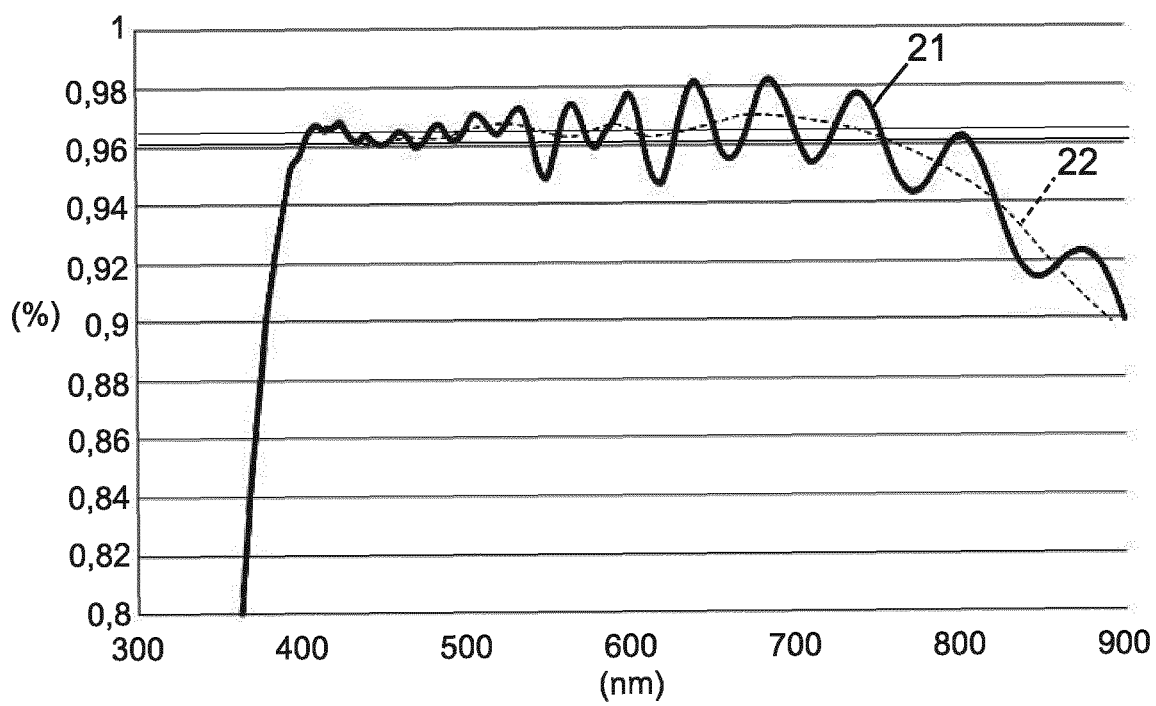
FIG. 2 is a transmission diagram of a sapphire material sample treated by PVD (Physical Vapor Deposition) according to a prior art method.

FIG. 2 shows a transmission diagram of a sapphire material sample after being treated by PVD (Physical Vapor Deposition) according to a prior art method where both faces of the sapphire material sample have been PVD treated. Said PVD treatment has been performed by the Company Bloesch. Curve 21 is the measured transmission diagram of said sapphire material sample and curve 22 is a calculated average curve of the transmission of said sapphire material sample. Anti-glare properties are achieved and the mean transmission value over the visible range is approximately 95.5%. Reflection of the said sample is thus reduced by approximately 11% over the visible range thanks to both faces PVD treatment of the sapphire material sample.

The inventors have performed tests with sapphire material samples which have been treated according to the present invention.

Used sapphire material samples are either circular or square plates with respectively one inch diameter and 10 mm side; their thickness is equal to or less than 1 mm.

According to examples of embodiments of the present invention, samples of synthetic sapphire material were the subject of studies, with single- and multi-charged Helium ions for some samples, with single- and multi-charged Argon ions for other samples.

These single- and multi-charged gas ions were emitted by an ECR source (electron cyclotron resonance source).

The inventors conducted a first series of tests with:
A single- and multi-charged Helium ion beam of an amperage of 1 mA comprising $He^+$ and $He^{2+}$ ions; the acceleration voltage is 35 kV; the energy of He+ is 35 keV and that of $He^{2+}$ is 70 keV. The treatment doses are equal to $10^{16}$, $5\times10^{16}$ and $10^{17}$ ions/cm$^2$.
A single- and multi-charged Helium ion beam of an amperage of 1 mA comprising $Ar^+$, $Ar^{2+}$, $Ar^{3+}$ ions; the acceleration voltage is 35 kV; the energy of $Ar^+$ is 35 keV, that of $Ar^{2+}$ is 70 keV, that of $Ar^{3+}$ is 105 keV. The treatment doses are equal to $10^{16}$, $5\times10^{16}$ and $10^{17}$ ions/cm$^2$.

The treated samples move in relation to the beam with a speed of 120 mm/s and with a lateral pitch for each return movement of 4 mm (10% of the beam diameter measuring 40 mm). To reach the required dose, the treatment is performed in a plurality of passes.

The inventors conducted qualitative tests by observing the reflection of light from a neon lamp with the naked eye, on a slightly inclined treated surface for various doses. The image reflected from this neon lamp was observed at an angle of approximately 10°.

From these qualitative tests, it emerged that the reflection of the neon lamp in terms of lower contrast appears around a dose of $5\times10^{16}$ ions/cm$^2$ for argon and $10^{17}$ ions/cm$^2$ for helium.

The inventors also observed with qualitative observation tests that it is (compared to non-treated synthetic sapphire surfaces) easier and more comfortable to view the image of the object through synthetic sapphire surfaces treated according to the method according to the invention.

A preliminary study conducted on a multi-charged ion implantation simulator based on semi-empirical data developed by the inventors gives, under the treatment conditions cited above, the following results recorded in table 1 for helium and table 2 for argon.

TABLE 1

| Dose ($10^{16}$ He ions/cm$^2$) | Observable anti-glare effect | Atomic concentration He (%) | Implanted layer thickness |
|---|---|---|---|
| 1 | no | 0.8% | 200 nm |
| 5 | no | 4% | 200 nm |
| 10 | yes | 10% | 200 nm |

TABLE 2

| Dose ($10^{16}$ Ar ions/cm$^2$) | Observable anti-glare effect | Atomic concentration Ar (%) | Implanted thickness |
|---|---|---|---|
| 1 | no | 2% | 120 nm |
| 5 | yes | 10% | 120 nm |
| 10 | yes | 18% | 120 nm |

As recommended by the method according to an embodiment of the present invention, the ion acceleration voltage setting is calculated so as to set the implanted thickness over a multiple of approximately 100 nm. It is possible to set these extrapolated values (acceleration voltage) more precisely during an experimental adjustment phase using precise interferometric means for evaluating the optimal reduction of the reflection coefficient.

Further experiments have been performed and transmission performances of the samples have been measured.

FIGS. 3 to 14 show transmission diagrams of sapphire material samples treated by the method of the present invention that have been measured after treating sapphire material samples according to following experimental conditions:

As far as FIGS. 3 to 14 are concerned: the single- and/or multi-charged gas ion beam is a single- and multi-charged oxygen ion, $O^+$, $O^{2+}$, $O^{3+}$, beam; estimated distribution of O ions is following: 60% of $O^+$, 30% of $O^{2+}$, 10% of $O^{3+}$.

Figure 3:
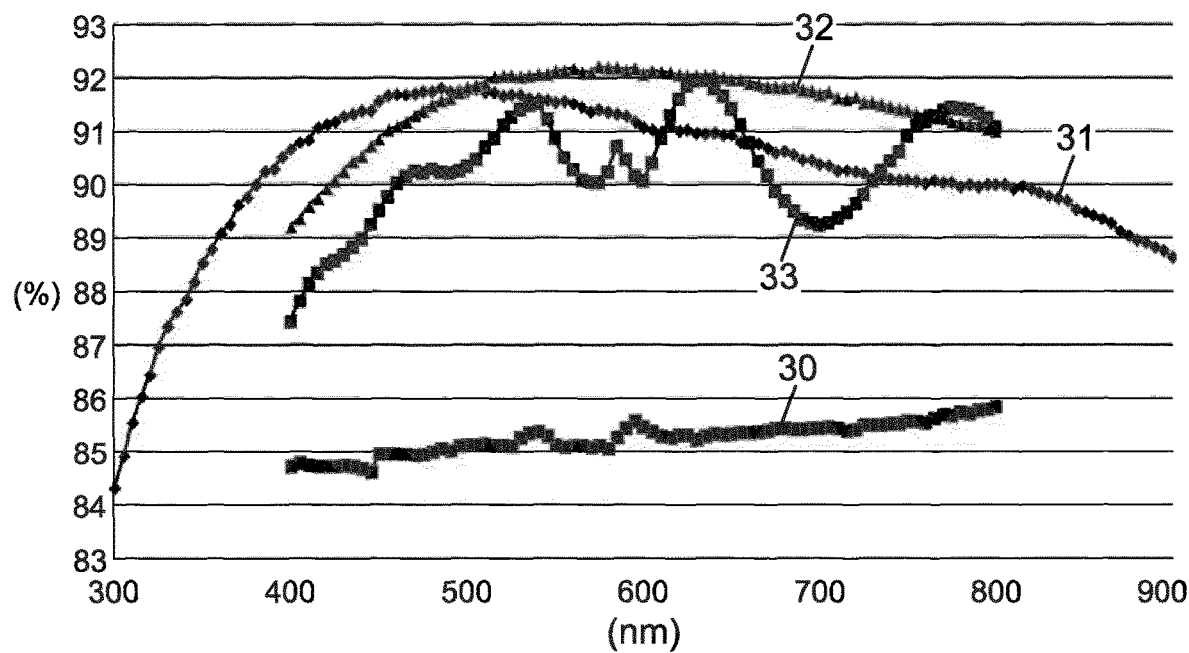
FIGS. 3 to 14 are transmission diagrams of sapphire material samples treated by the method of the present invention.
Figure 4:
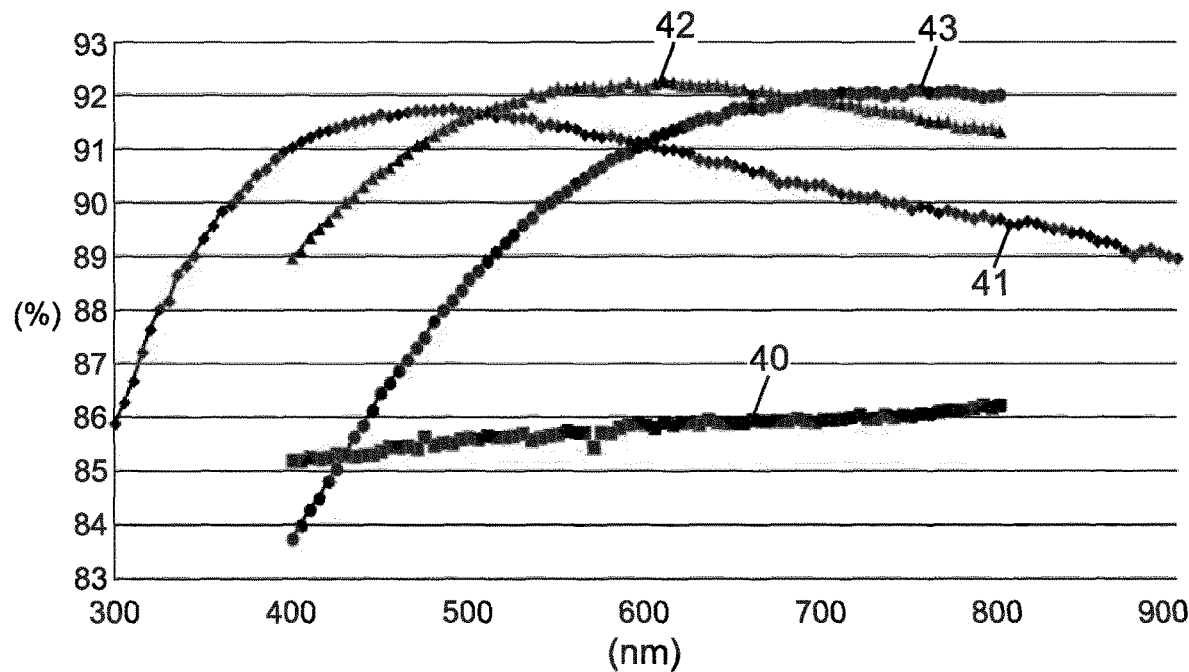

As far as FIGS. 3 and 4 are concerned: only a face of the sapphire material samples has been treated;

As far as FIGS. 5 to 14 are concerned: both faces of the sapphire material samples have been treated.

As far as FIGS. 3, 5, 7 and 13 are concerned: plan(s) A of the sapphire material samples has (have) been treated.

As far as FIGS. 4, 6, 8 to 12 and 14 are concerned: plan(s) C of the sapphire material samples has (have) been treated.

In following data, ion doses (further called "dose") are expressed in $10^{16}$ ions/cm$^2$, and acceleration voltages (further called "voltage") are expressed in kV.

In FIG. 3, curve 30 relates to an untreated sapphire material sample; curve 31 to a sapphire material sample treated with a dose=11 and a voltage=17.5; curve 32 to a sapphire material sample treated with a dose=12.5 and a voltage=25; curve 33 to a sapphire material sample treated with a dose=15 and a voltage=32.5.

In FIG. 4, curve 40 relates to an untreated sapphire material sample; curve 41 to a sapphire material sample treated with a dose=11 and a voltage=17.5; curve 42 to a sapphire material sample treated with a dose=12.5 and a voltage=25; curve 43 to a sapphire material sample treated with a dose=15 and a voltage=32.5.

Figure 5:
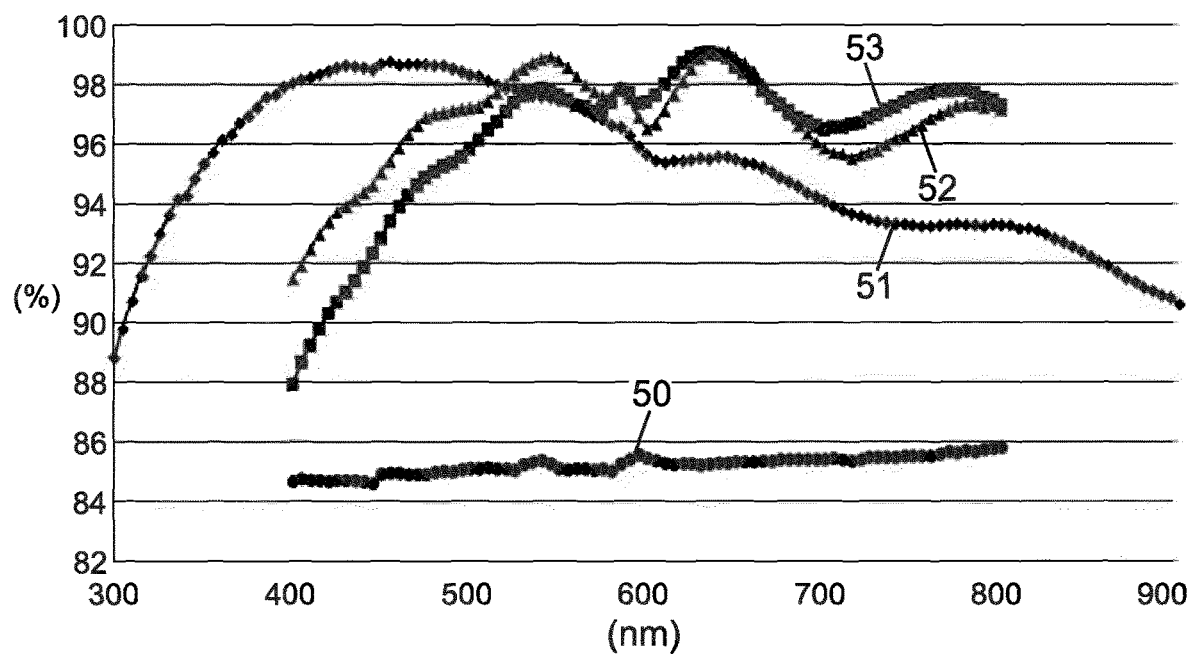

In FIG. 5, curve 50 relates to an untreated sapphire material sample; curve 51 to a sapphire material sample treated with a dose=11 and a voltage=17.5; curve 52 to a sapphire material sample treated with a dose=12.5 and a voltage=25; curve 53 to a sapphire material sample treated with a dose=15 and a voltage=32.5.

Figure 6:
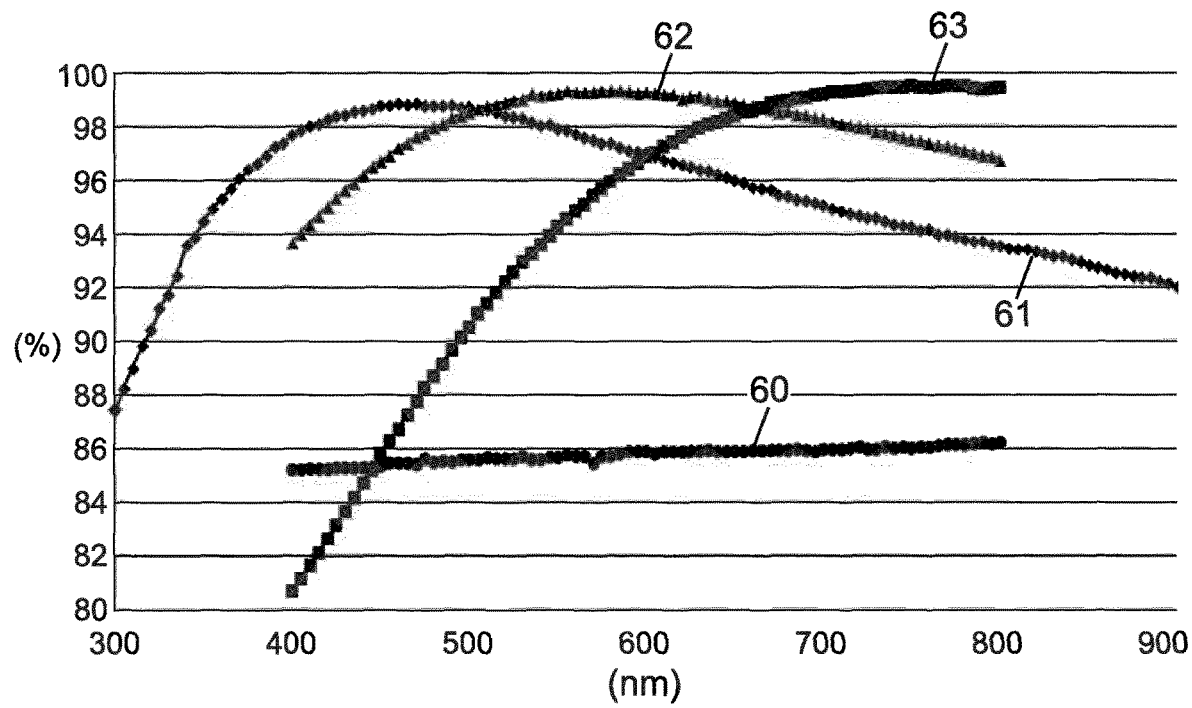

In FIG. 6, curve 60 relates to an untreated sapphire material sample; curve 61 to a sapphire material sample treated with a dose=11 and a voltage=17.5; curve 62 to a sapphire material sample treated with a dose=12.5 and a voltage=25; curve 63 to a sapphire material sample treated with a dose=15 and a voltage=32.5.

Figure 7:
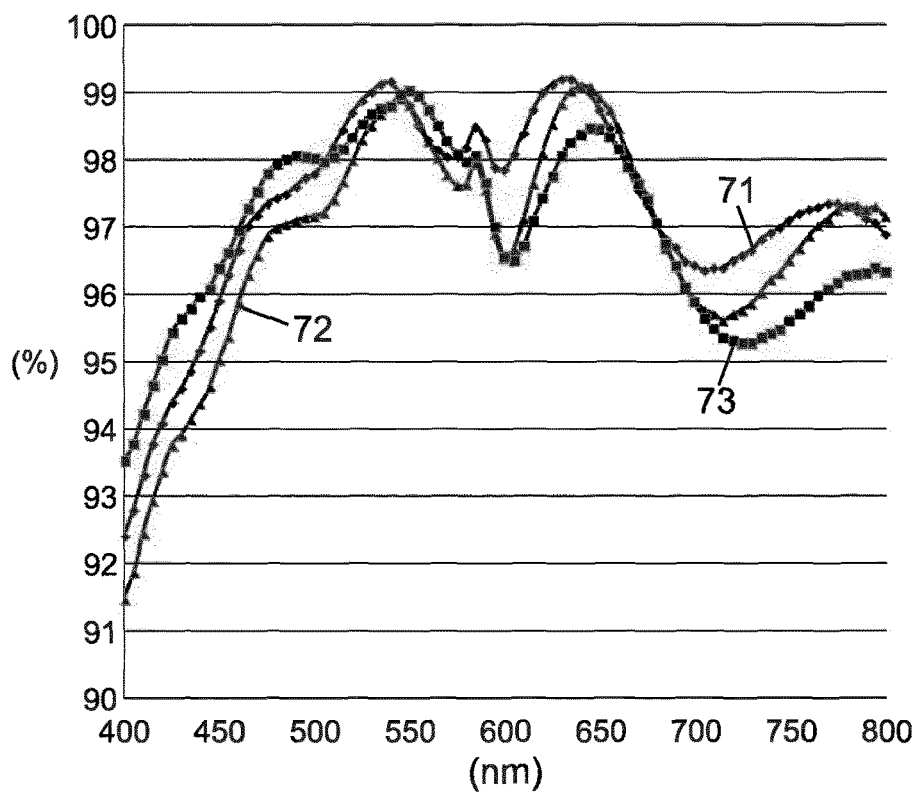

In FIG. 7, curve 71 to a sapphire material sample treated with a dose=11.9 and a voltage=25; curve 72 to a sapphire material sample treated with a dose=12.5 and a voltage=25; curve 73 to a sapphire material sample treated with a dose=13.1 and a voltage=25.

Figure 8:
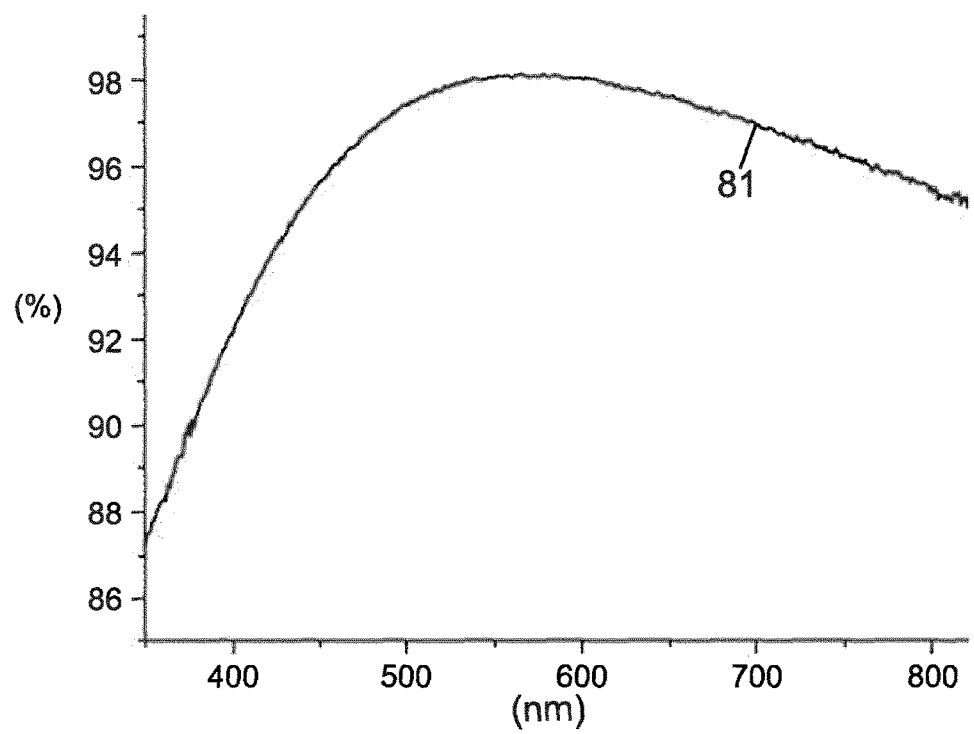

In FIG. 8, curve 81 to a sapphire material sample treated with a dose=12.5 and a voltage=22.5.

Figure 9:
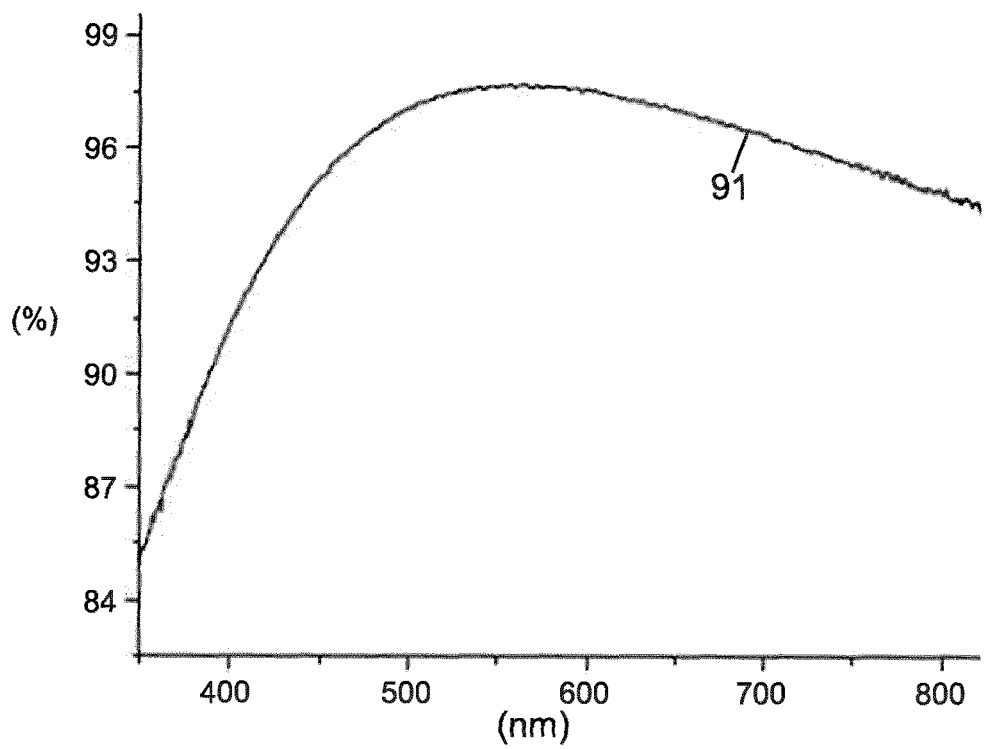

In FIG. 9, curve 91 to a sapphire material sample treated with a dose=13.8 and a voltage=22.5.

Figure 10:
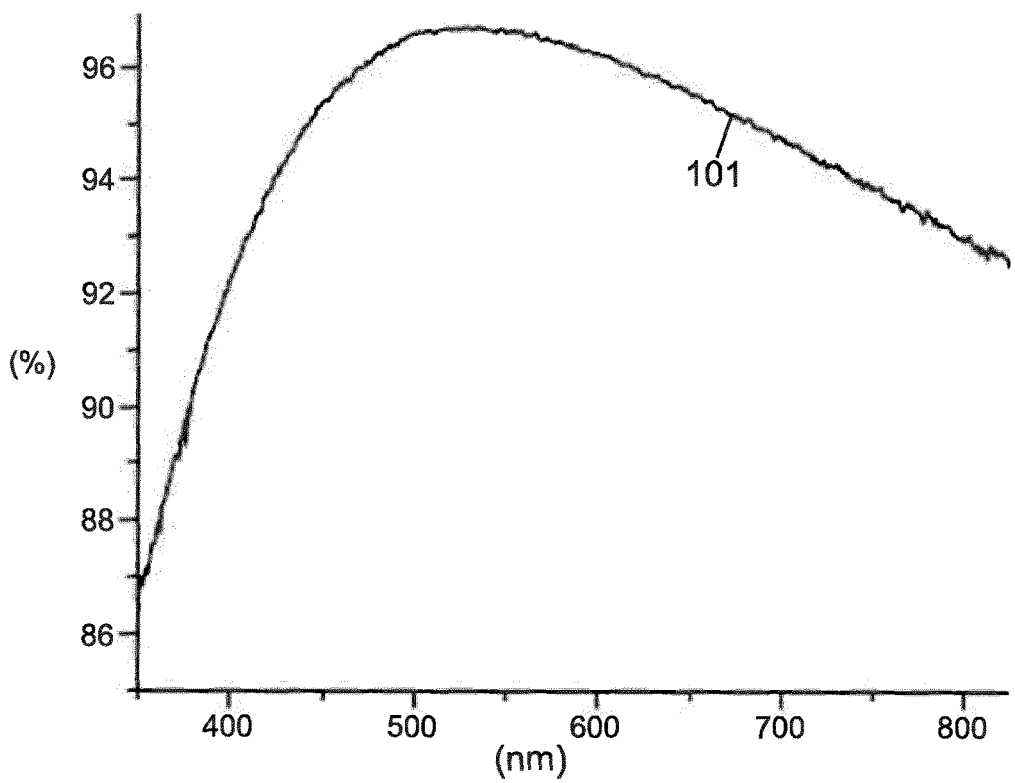

In FIG. 10, curve 101 to a sapphire material sample treated with a dose=15 and a voltage=22.5.

Figure 11:
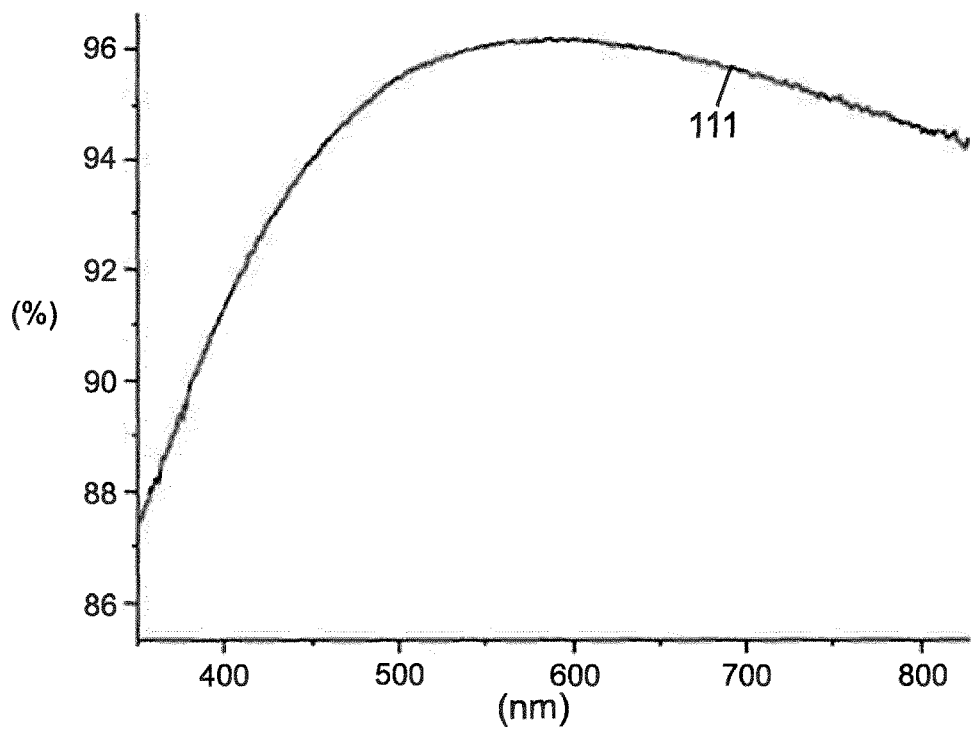

In FIG. 11, curve 111 to a sapphire material sample treated with a dose=15 and a voltage=25.

Figure 12:
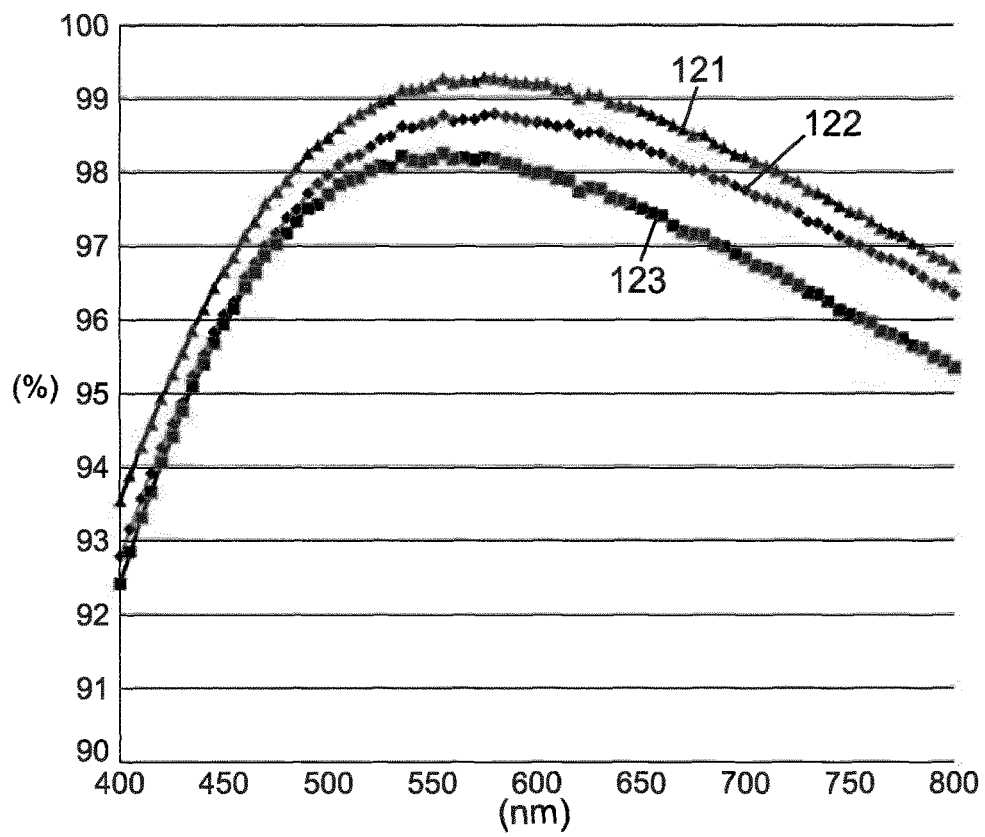

In FIG. 12, curve 121 to a sapphire material sample treated with a dose=11.9 and a voltage=25; curve 122 to a sapphire material sample treated with a dose=12.5 and a voltage=25; curve 123 to a sapphire material sample treated with a dose=13.1 and a voltage=25.

Figure 13:
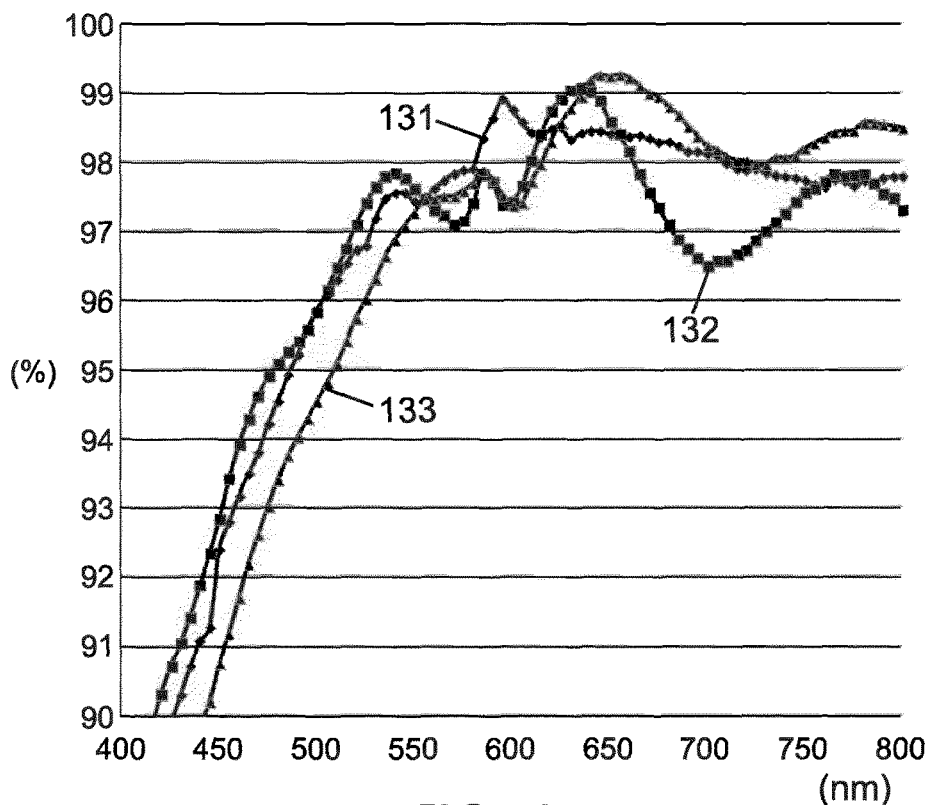

In FIG. 13, curve 131 to a sapphire material sample treated with a dose=13.5 and a voltage=32.5; curve 132 to a sapphire material sample treated with a dose=15 and a voltage=32.5; curve 133 to a sapphire material sample treated with a dose=16.5 and a voltage=32.5.

Figure 14:
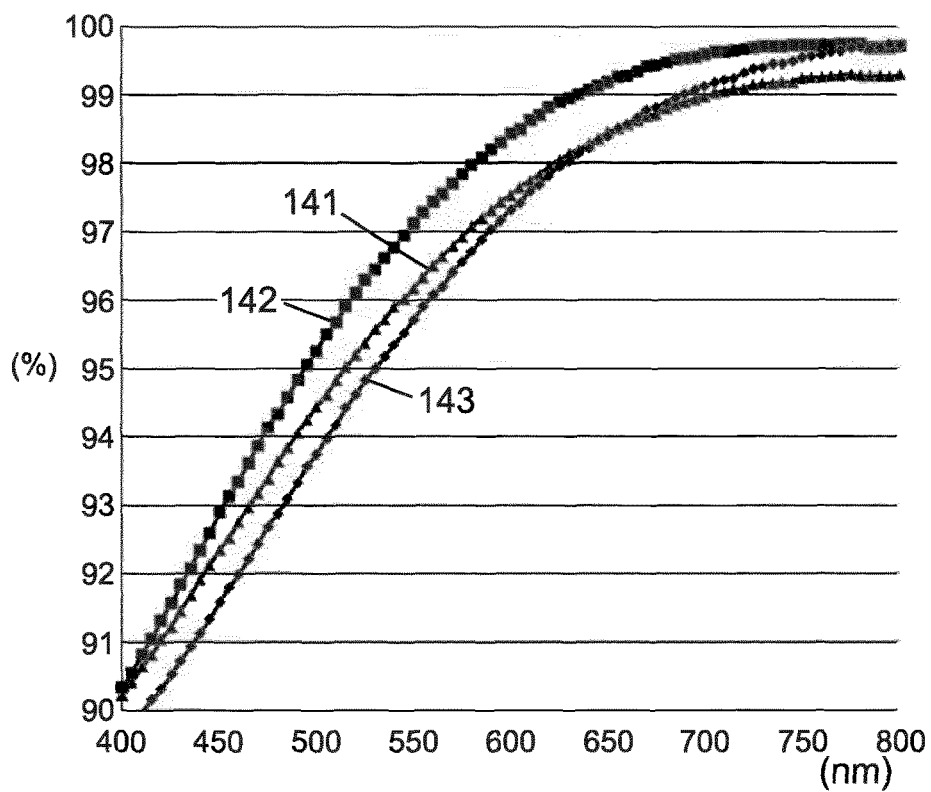

In FIG. 14, curve 141 to a sapphire material sample treated with a dose=13.5 and a voltage=32.5; curve 142 to a sapphire material sample treated with a dose=15 and a voltage=32.5; curve 143 to a sapphire material sample treated with a dose=16.5 and a voltage=32.5.

Thanks to these figures, one can consider the influence of a plurality of process parameters.

FIGS. 3 and 4 can be respectively compared to FIGS. 5 and 6 to demonstrate the influence of single face versus double faces treatments.

FIGS. 7, 8 to 10, 12, 13 and 14 show the influence of doses for a constant voltage.

Measured results reported in FIGS. 3 to 14 demonstrate that bombardment of a surface of the sapphire material, said surface facing a medium different from the sapphire material, by a single- and/or multi-charged gas ion beam is suitable to produce an ion implanted layer in the sapphire material that provides an anti-glare treatment in the visible range.

Surprisingly, very high transmissions have been achieved in the visible range. Synthetic sapphire material comprising at least one surface with implanted ions have been obtained where the reflection of an incident wave in the visible range on said surface is equal or less to 2%, as for example equal or less to 1%, when measured at a 560 nm wavelength.

Transmission results of sapphire materials treated according to the present invention can thus be significantly higher than those obtained sapphire materials treated by PVD (Physical Vapor Deposition).

Thanks to results reported in FIGS. 3 to 14, one can determine preferred ranges to implement the method according to the present invention, where:

one chooses oxygen (O) as single- and/or multi-charged ions;

one chooses a single- and/or multi-charged gas ion dose per unit of surface area and an acceleration voltage value according to following equation:

$$0.02 \leq DC^2/(T\Delta n) \leq 2; \text{ wherein:}$$

D is a single- and/or multi-charged gas ion dose per unit of surface area value to be chosen, expressed in $10^{16}$ ions/cm$^2$;

C=M/15, where M is the atomic mass the chosen ion.

T is an acceleration voltage to be chosen, expressed in kV;

Δn is the refractive index difference between the refractive index, nS, of the sapphire material to be treated and the refractive index, nM, of the medium facing the surface to be ion bombarded of the sapphire material.

In the present embodiment M (Oxygen)=16; nM=nA (Air)=1; Ns=1.76. When using Oxygen as single- and/or multi-charged ions and air as the medium facing the surfaces of the sapphire material, preferred ranges are $0.015 \leq D/T \leq 1.3$;

Even preferred ranges are $0.5 \leq D/T \leq 1$.

FIGS. 15 to 18 illustrate data that can be useful for choosing parameters when using Oxygen as single- and/or multi-charged ions.

Figure 15:
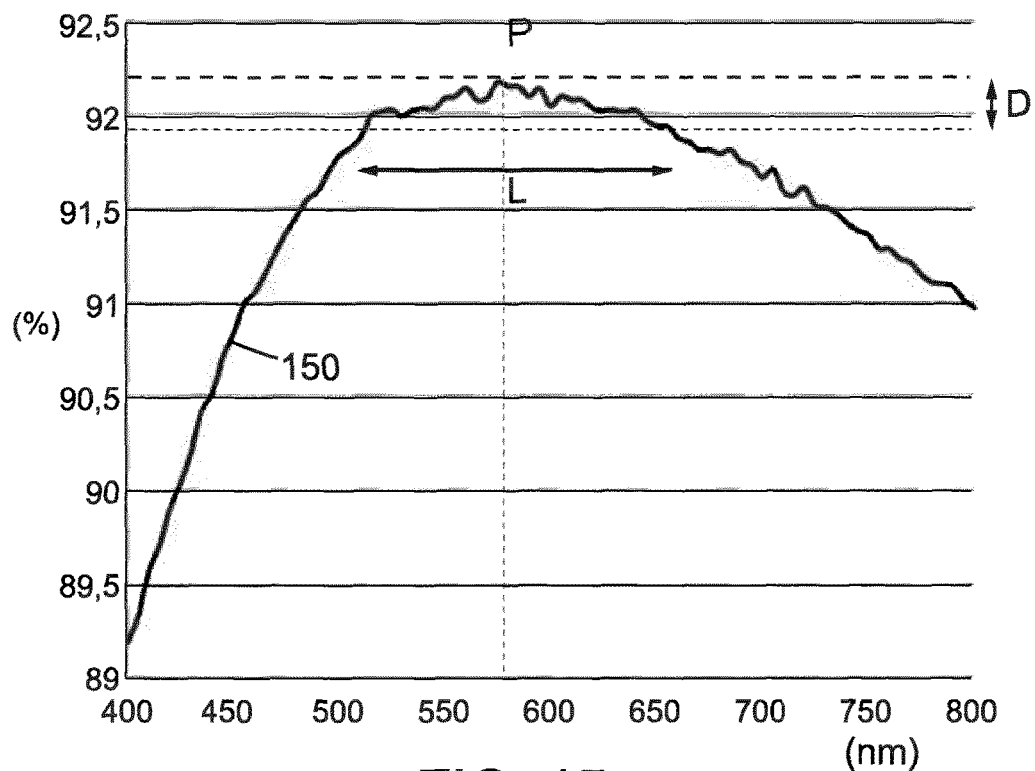
FIGS. 15 to 18 are diagrams used to discuss results of sapphire material samples treated by the method of the present invention.
Figure 16:
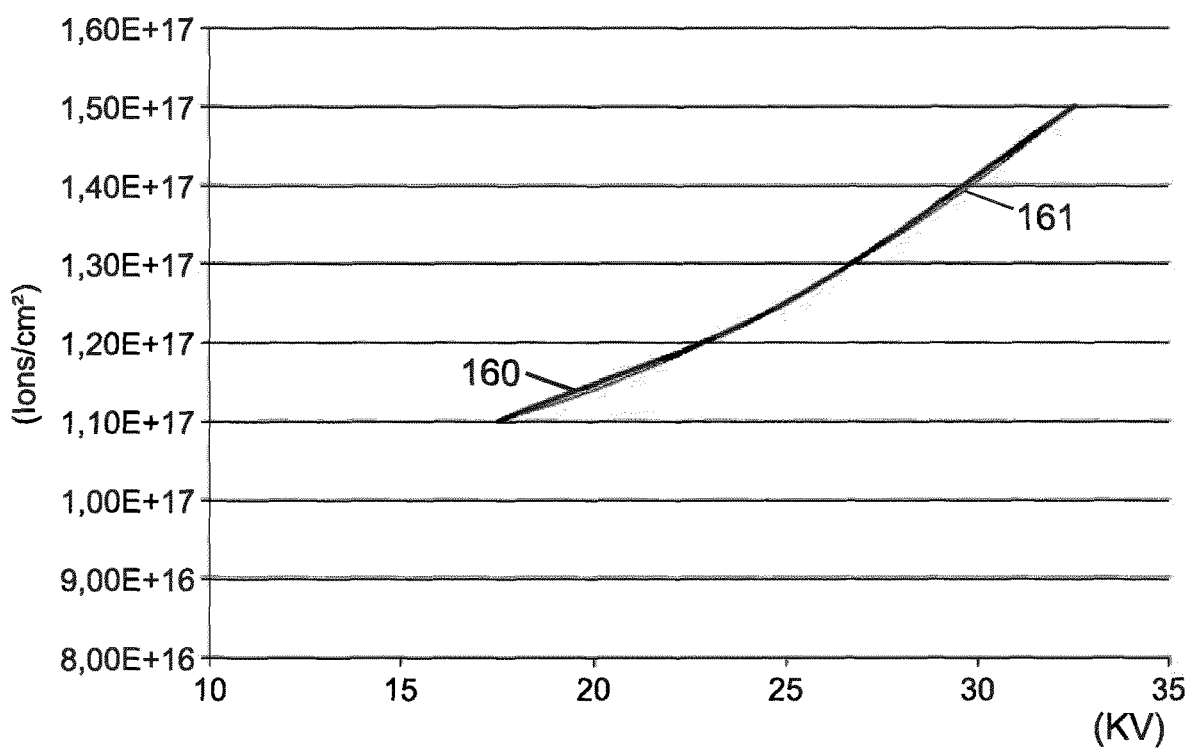

Transmission diagrams of sapphire material samples treated by the method of the present invention can be analyzed on the basis of FIG. 15; one determinate three parameters on the basis of transmission diagram (150), where P is the transmission peak position (in nm), D is a variability parameter (in transmission unit), L is the width (in nm) of the transmission diagram corresponding to the D variability.

Based on results of FIGS. 3 to 14, FIG. 16 shows the optimal calculated dose for obtaining a maximal transmission peak (P) as a function of the acceleration voltage; curve 160 relates to a sapphire material treated according to a A plane and curve 161 relates to a sapphire material treated according to a C plane.

Figure 17:
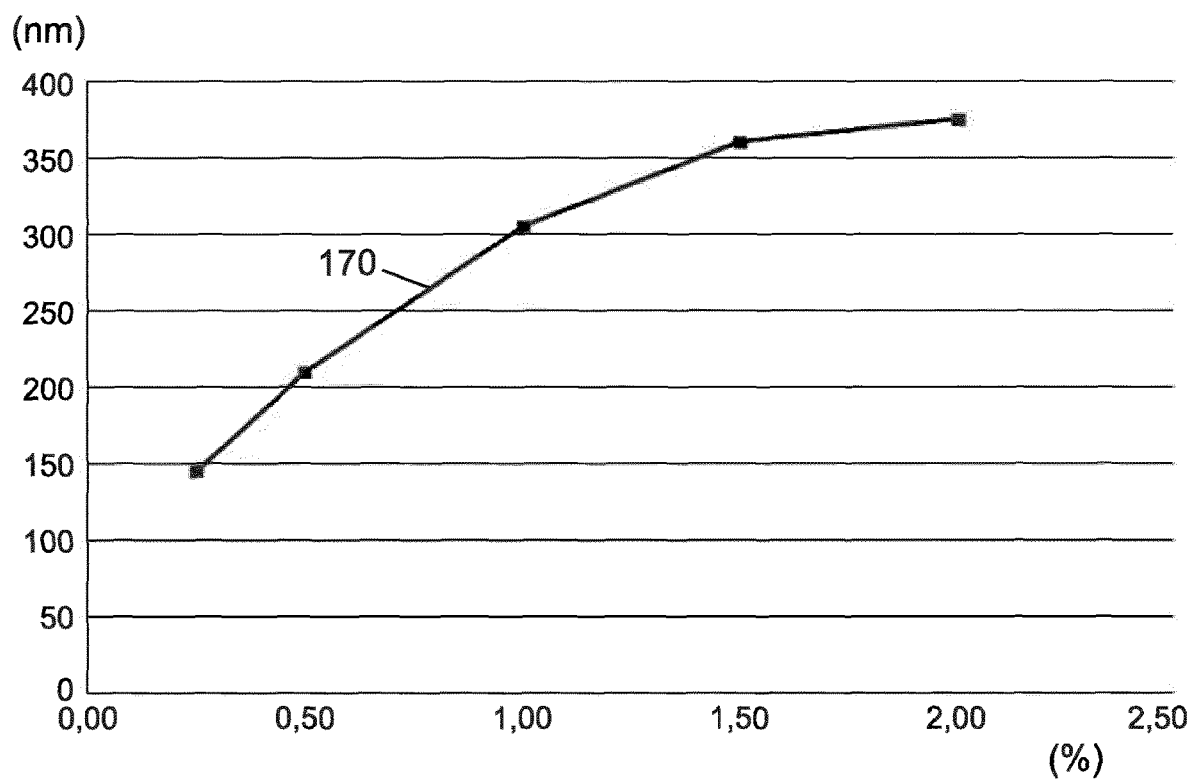
Figure 18:
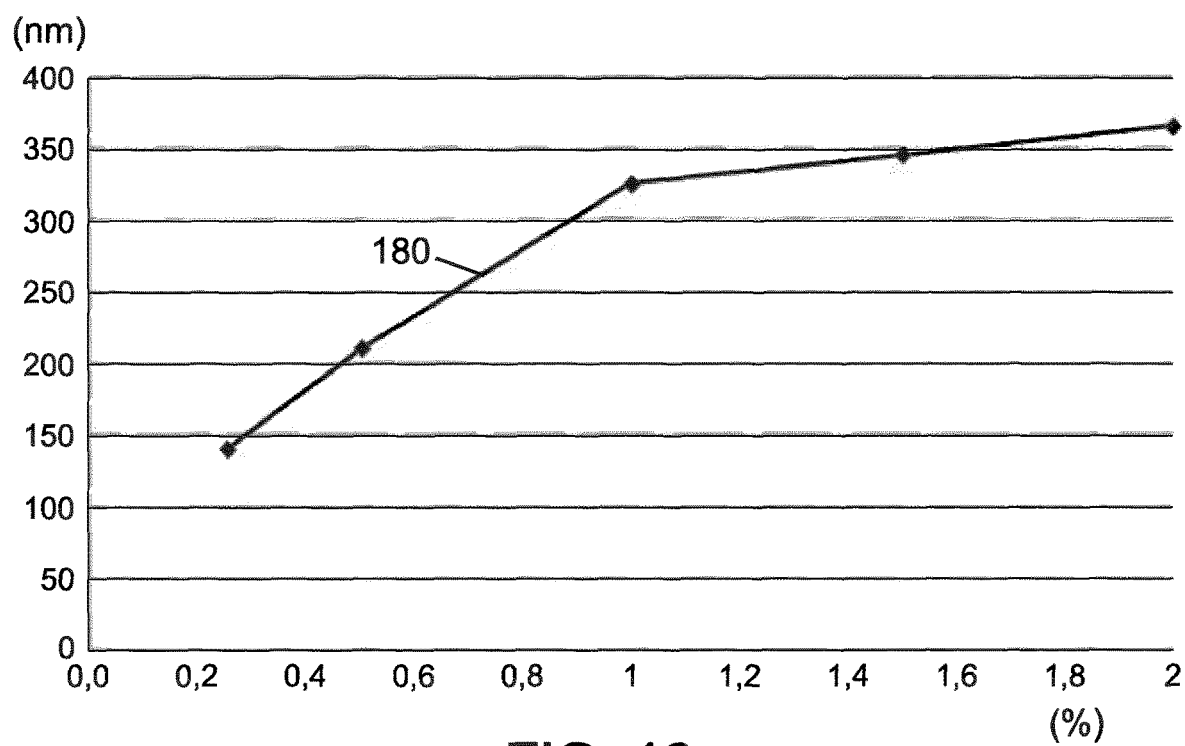

Based on results of preceding figures, FIG. 17 shows the variation of the width of the transmission diagram (L) as a function of the variability parameter (D) for a sapphire material treated according to a A plane.

Based on results of preceding figures, FIG. 17 shows the variation of the width of the transmission diagram (L) as a function of the variability parameter (D) for a sapphire material treated according to a C plane.

FIGS. 19 to 22 show transmission diagrams of sapphire material samples treated by the method of the present invention that have been measured after treating sapphire material samples according to following experimental conditions:

As far as FIGS. 19 to 22 are concerned: the single- and/or multi-charged gas ion beam is a single- and multi-charged nitrogen ion, $N^+$, $N^{2+}$, $N^{3+}$, beam; estimated distribution of N ions is following: 57% of $N^+$, 32% of $N^{2+}$, 11% of $N^{3+}$; only one face of the sapphire material samples has been treated.

Figure 19:
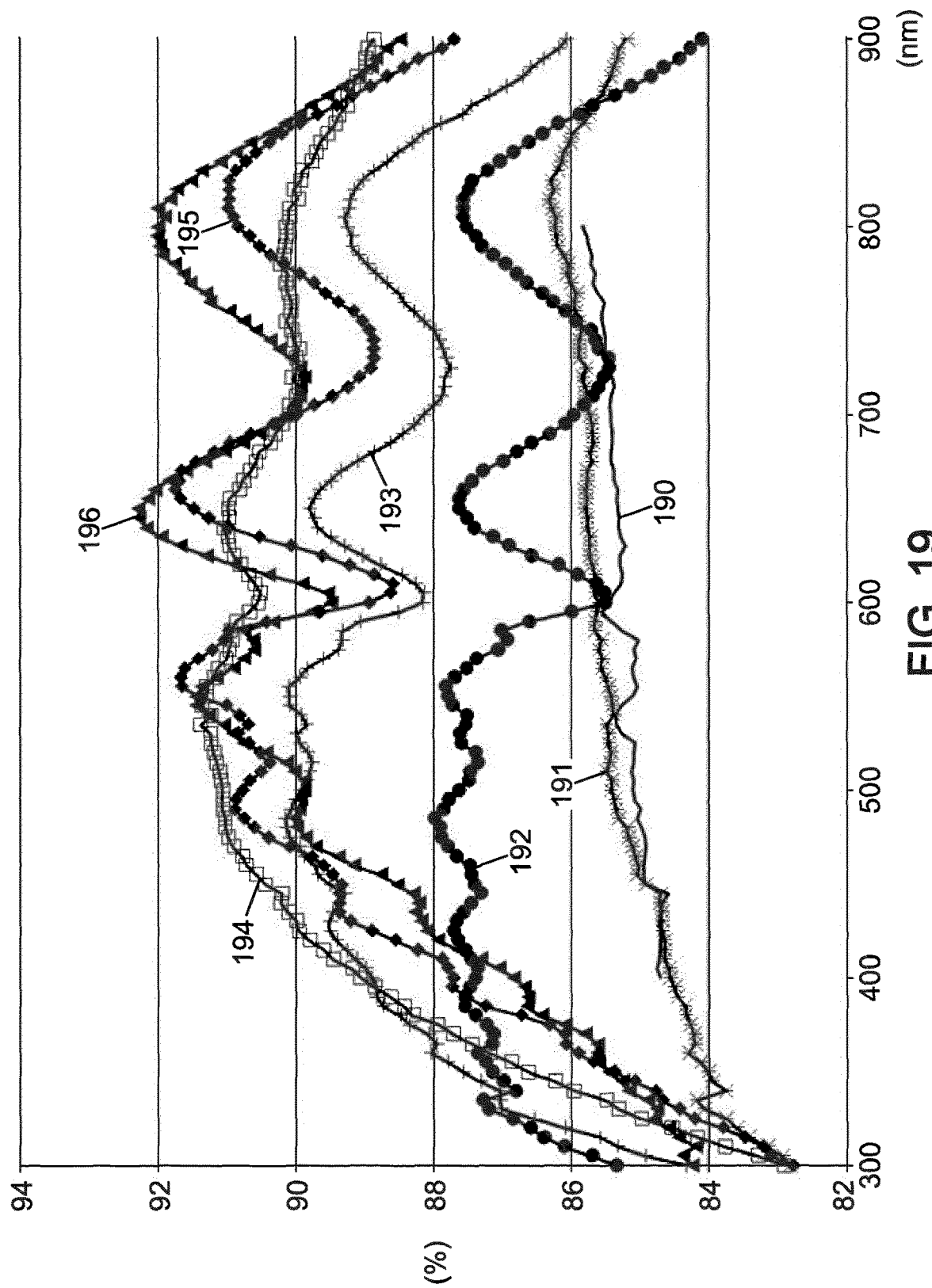
FIGS. 19 to 23 are transmission diagrams of sapphire material samples treated by the method of the present invention.
Figure 20:
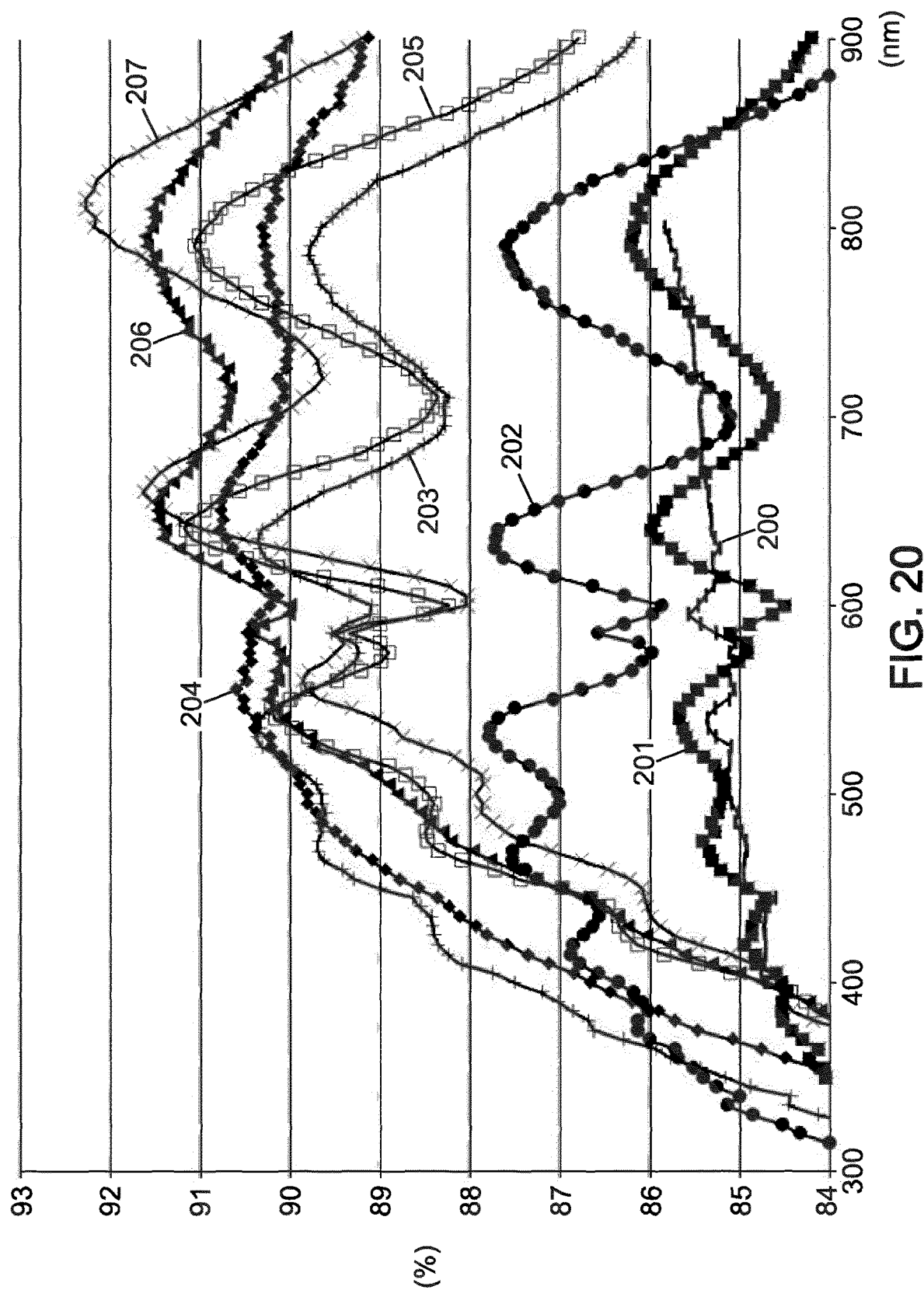

As far as FIGS. 19 and 20 are concerned: plan A of the sapphire material samples has been treated.

Figure 21:
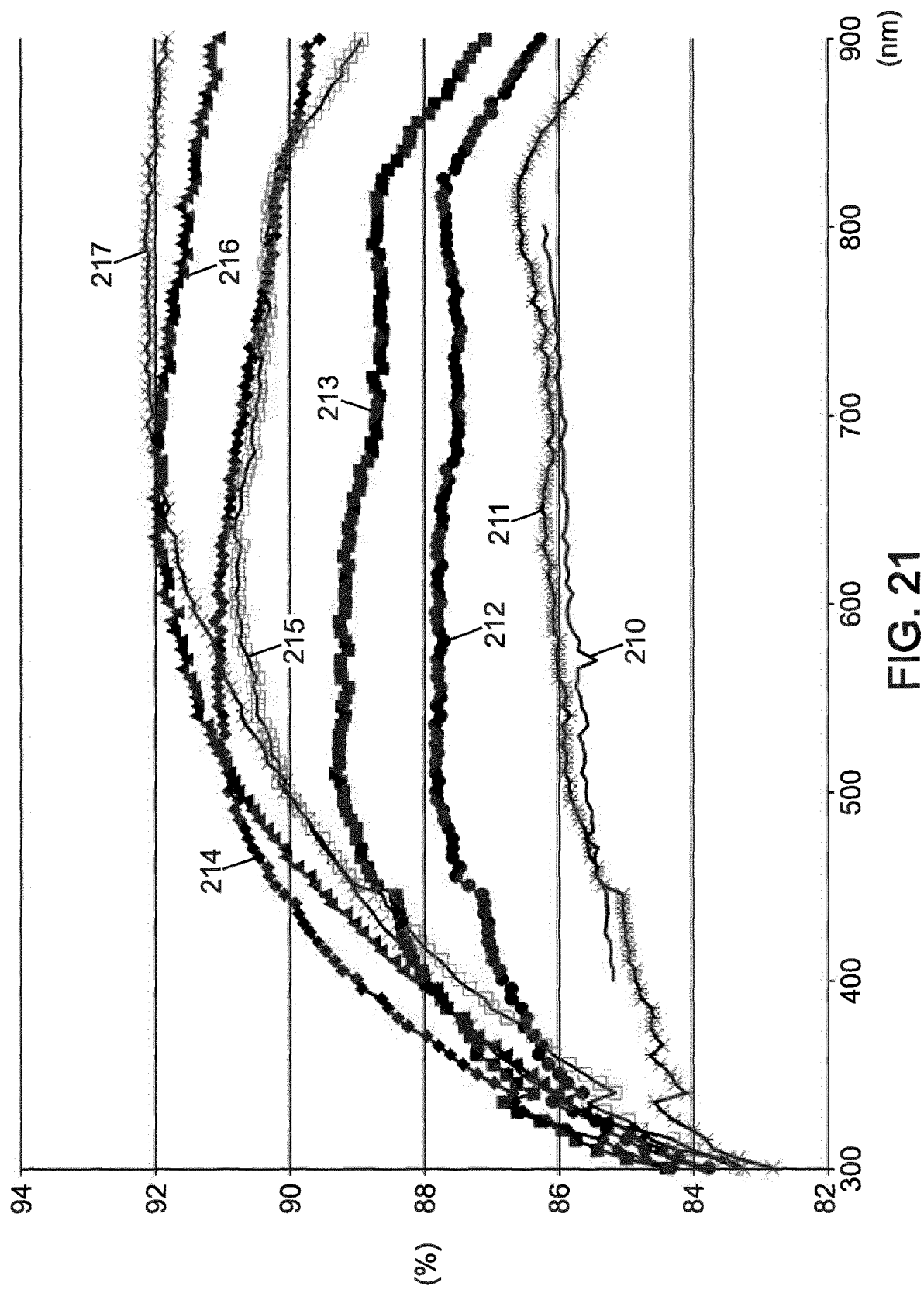
Figure 22:
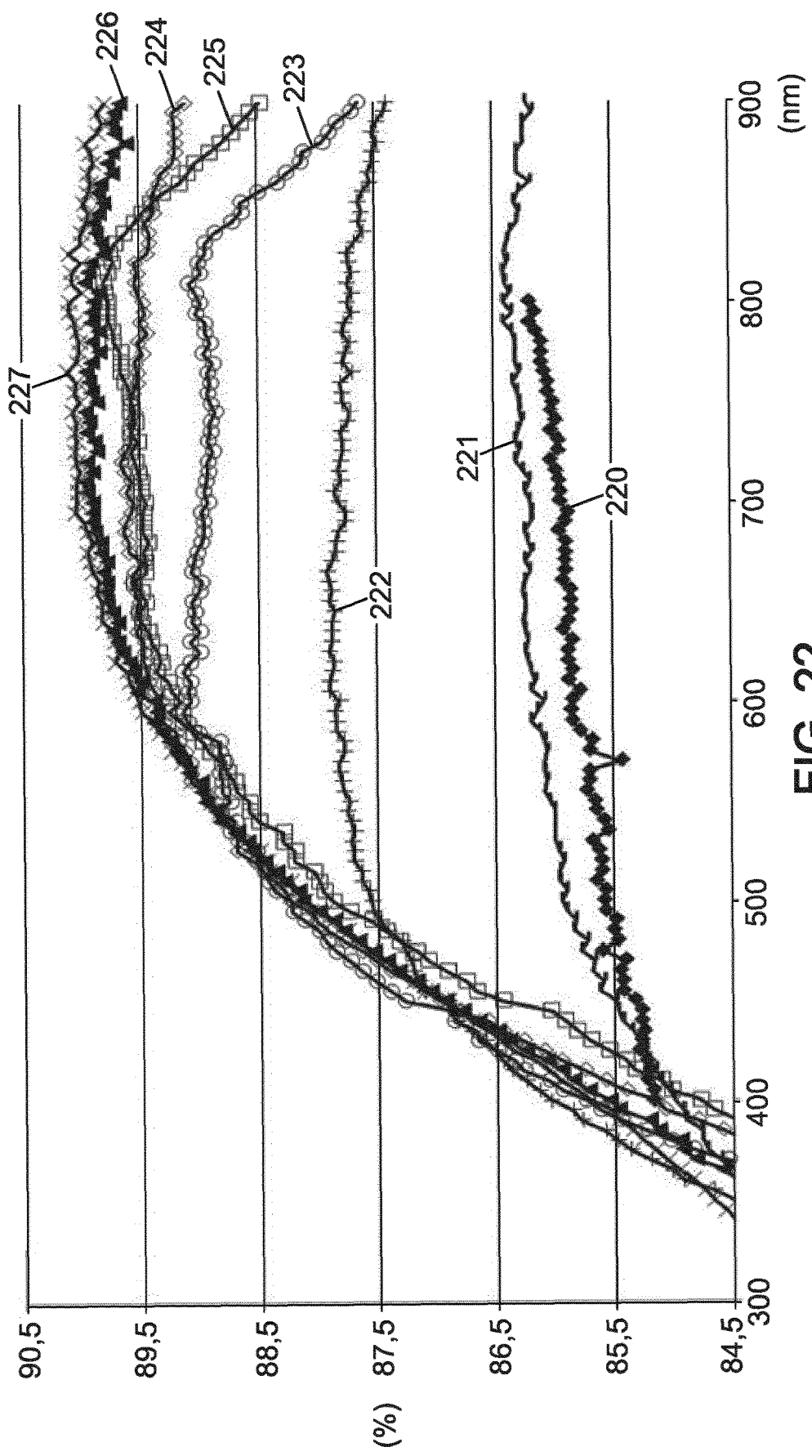

As far as FIGS. 21 and 22 are concerned: plan C of the sapphire material samples has been treated.

In following data, ion doses (further called "dose") are expressed in $10^{16}$ ions/cm$^2$, and acceleration voltages (further called "voltage") are expressed in kV.

As far as FIGS. 19 and 21 are concerned, the voltage=20;
As far as FIGS. 20 and 22 are concerned, the voltage=25;

In FIG. 19, curve 190 relates to an untreated sapphire material sample; curve 191 to a sapphire material sample treated with a dose=2.5; curve 192 to a sapphire material sample treated with a dose=5; curve 193 to a sapphire material sample treated with a dose=7.5; curve 194 to a sapphire material sample treated with a dose=10; curve 195 to a sapphire material sample treated with a dose=12.5; curve 196 to a sapphire material sample treated with a dose=15.

In FIG. 20, curve 200 relates to an untreated sapphire material sample; curve 201 to a sapphire material sample treated with a dose=2.5; curve 202 to a sapphire material sample treated with a dose=5; curve 203 to a sapphire material sample treated with a dose=7.5; curve 204 to a sapphire material sample treated with a dose=10; curve 205 to a sapphire material sample treated with a dose=12.5; curve 206 to a sapphire material sample treated with a dose=15; curve 207 to a sapphire material sample treated with a dose=17.5.

In FIG. 21, curve 210 relates to an untreated sapphire material sample; curve 211 to a sapphire material sample treated with a dose=2.5; curve 212 to a sapphire material sample treated with a dose=5; curve 213 to a sapphire material sample treated with a dose=7.5; curve 214 to a sapphire material sample treated with a dose=10; curve 215 to a sapphire material sample treated with a dose=12.5; curve 216 to a sapphire material sample treated with a dose=15; curve 217 to a sapphire material sample treated with a dose=17.5.

In FIG. 22, curve 220 relates to an untreated sapphire material sample; curve 221 to a sapphire material sample treated with a dose=2.5; curve 222 to a sapphire material sample treated with a dose=5; curve 223 to a sapphire material sample treated with a dose=7.5; curve 224 to a sapphire material sample treated with a dose=10; curve 225 to a sapphire material sample treated with a dose=12.5; curve 226 to a sapphire material sample treated with a dose=15; curve 227 to a sapphire material sample treated with a dose=17.5.

Anti-glare properties can thus be achieved thanks to the method of the invention when using Nitrogen ions.

Figure 23:
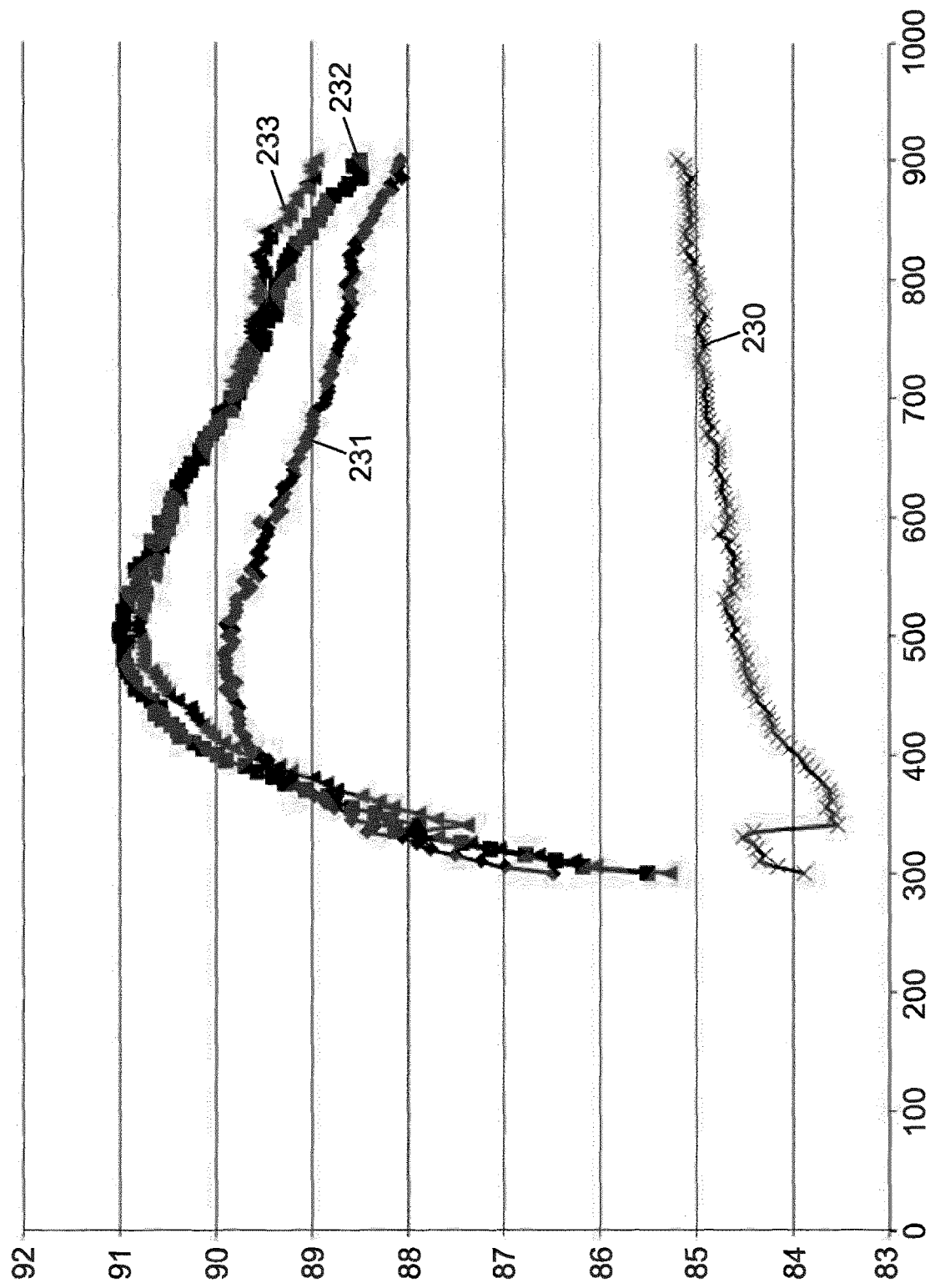

FIG. 23 shows transmission diagrams of sapphire material samples treated by the method of the present invention that have been measured after treating sapphire material samples according to following experimental conditions:

the single- and/or multi-charged gas ion beam is a single- and multi-charged Argon ion, $Ar^+$, $Ar^{2+}$, $Ar^{3+}$, beam; estimated distribution of Ar ions is following: 71% of $Ar^+$, 23% of $Ar^{2+}$, 6% of $Ar^{3+}$; the two faces of the sapphire material samples have been treated. The treated is plan A of the sapphire material. The acceleration voltage is 35 kV. In following data, ion doses (further called "dose") are expressed in $10^{16}$ ions/cm$^2$:

Curve 230 relates to an untreated sapphire material sample; curve 231 to a sapphire material sample treated with a dose=2.5; curve 232 to a sapphire material sample treated with a dose=7.5; curve 233 to a sapphire material sample treated with a dose=10.

Anti-glare properties can thus be achieved thanks to the method of the invention when using argon ions.

Based on the data that have been gathered, one can estimate with a high level of confidence that other ions should be suitable to implement the method of the invention and are relevant to produce anti-glare properties as far as sapphire material is concerned.

It has been here above demonstrated that helium (He) and argon (Ar) ions are suitable to implement the method of the invention; accordingly, other "noble" gas ions appears to be also suitable to implement the method of the invention, such as neon (Ne), krypton (Kr) and xenon (Xe). Without seeking to be bound to any scientific theory, the inventors suggest that noble gas ions create nano-bubbles in sapphire material that make possible lowering the refractive index of the sapphire material when said ions are implanted.

It has been here above demonstrated that nitrogen (N) and oxygen (O) ions are suitable to implement the method of the invention; accordingly, other Periodic Table surrounding ions appears to be also suitable to implement the method of the invention, such as boron (B), carbon (C), fluorine (F), silicon (Si), phosphorus (P) and sulphur (S). Without seeking to be bound to any scientific theory, the inventors suggest that oxygen, nitrogen and Periodic Table surrounding ions create polarity lowering in the local environment of a sapphire material that make possible lowering the refractive index of the sapphire material when said ions are implanted.

One can also make the assumption that all said ions contribute to lowering the refractive index of the sapphire material when said ions are implanted due to at least partial amorphisation process of the implanted layer.

Without seeking to be bound to any scientific theory, the inventors suggest ways to interpret results and approaches that may be suitable to anticipate how obtaining optimized results.

Examples are given on the basis of here above results obtained when using oxygen ions.

Figure 24:
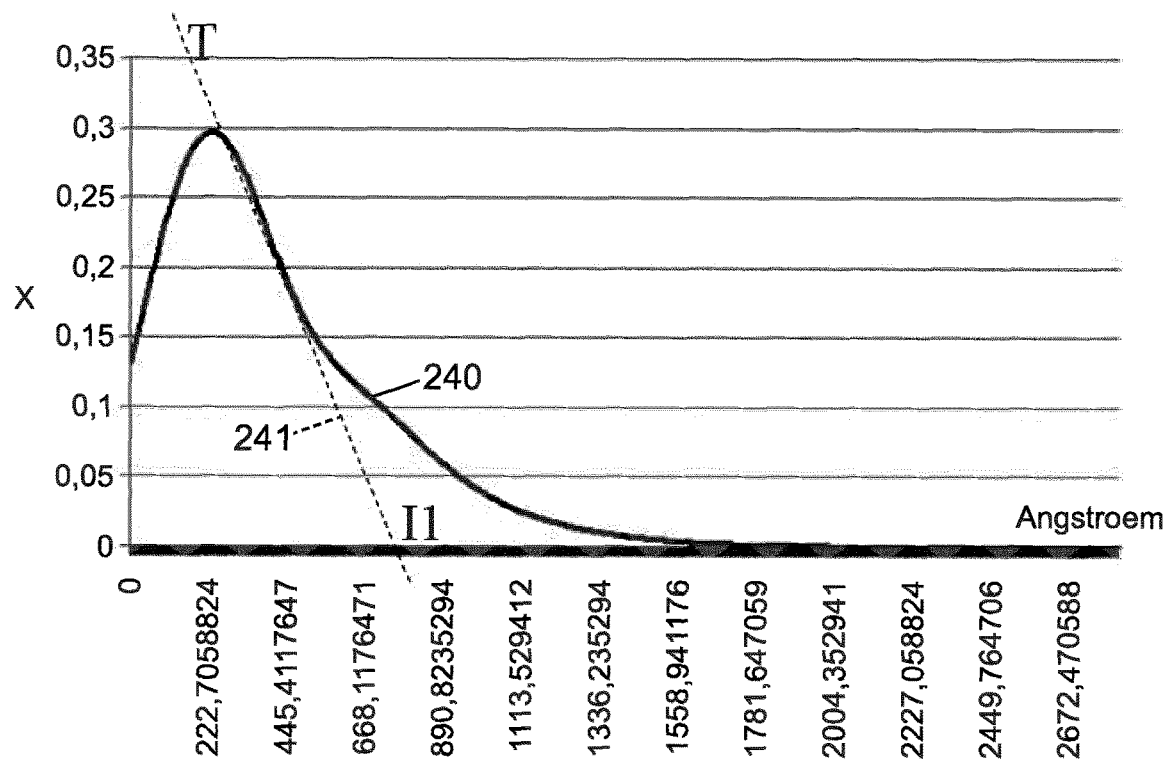
FIGS. 24 to 28 are diagrams used to discuss results of sapphire material samples treated by the method of the present invention.
Figure 25:
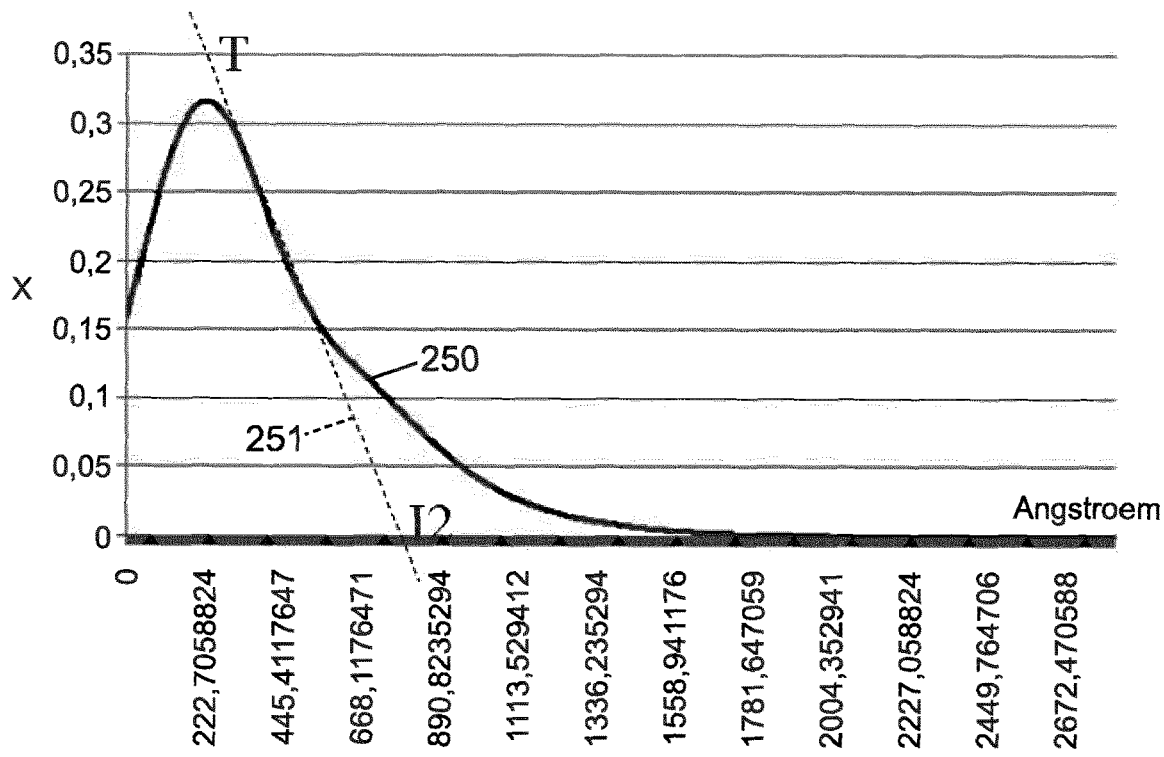
Figure 26:
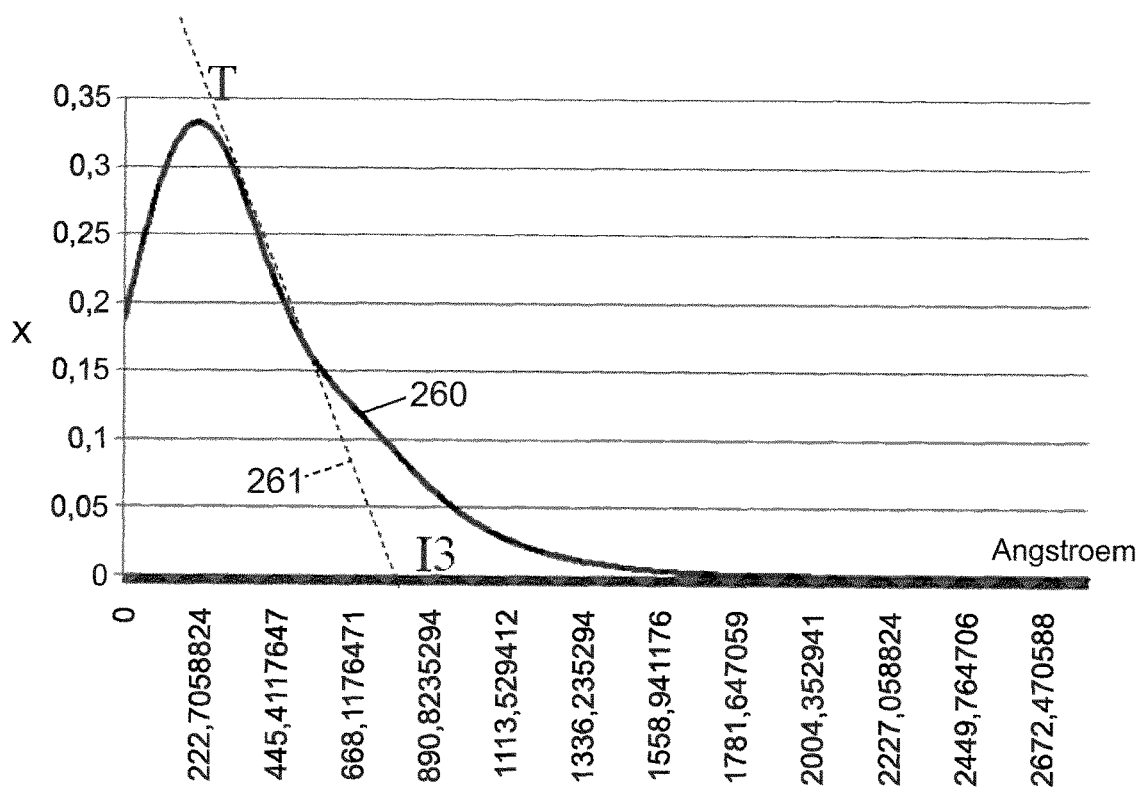

FIGS. 24, 25, 26 represent the implanted oxygen concentration profiles X (on the y-axis) (respectively 240, 250, 260) as a function of the depth expressed in Angstrom (on the x-axis), calculated for 3 different doses 1.25, 1.375, 1.5× $10^{17}$ oxygen ions/cm$^2$. These concentration profiles were digitally simulated accounting for a single- and multi-charged $O^+$, $O^{2+}$, $O^{3+}$ ion beam, subject to an acceleration voltage of 22.5 kV. The $O^+/O^{2+}/O^{3+}$ ion distribution is estimated to be equal to 58%/31%/11% with respective energies equal to 22.5 keV/45 keV/67.5 keV.

On the y-axis, X expresses the additional atomic concentration of implanted oxygen ions added to the chemical composition of pure sapphire described by the formula $Al_2O_3$. One can consider that the chemical composition of sapphire doped by oxygen implantation has a chemical composition described by the chemical formula $Al_2O_{3+X}$ which is associated with a sub oxide form of alumina ($Al_2O_3$). X is equal to 0 beyond the implanted zone and adopts a value different to zero in the implanted zone. The inventors consider that the anti-glare layer created by oxygen implantation consists of a sub oxide form of alumina and has the chemical formula $Al_2O_{3+x}$ where X is between 0.01 and 0.5 in the implanted zone.

The inventors observed in FIGS. 24, 25 and 26 that the atomic concentration X of implanted oxygen ions has a maximum value between 0.35 and 0.3, not exceeding 0.5 and has a value different to zero and decreasing in an implanted thickness equal to 80 nm. It is very likely that the gradual variation of X is related to the appearance of a favourable index gradient for the appearance of anti-reflective properties observed by the inventors. The inventors consider that the chemical and crystallographic composition of sapphire implanted with oxygen ions should change continuously in the implanted thickness changing from the surface end from a chemical formula $Al_2O_{3.5}$ in amorphous form, to a chemical formula $Al_2O_3$ in rhombohedra form (sapphire) at the boundary end of the implanted zone.

The inventors observed experimentally that an implanted thickness of 80 nm has a substantially comparable value to that corresponding to a quarter wavelength (560 nm) in sapphire: indeed (560 nm/1.76×4)=79.5 nm.

The implanted thickness corresponds to the zone wherein the atomic concentration of implanted oxygen ions is greater than or equal to 1% (in other words X=0.01). It is also possible to deduce this value by calculating the point of intersection I between the tangent (T) of the right side of the concentration profile and the x-axis, indicated as 241, 251, 261 in respectively FIGS. 24, 25, 26. FIGS. 24, 25, 26 feature the respective points of intersection 11, 12, 13 situated substantially around 80 nm (800 Angstroms).

Figure 27:
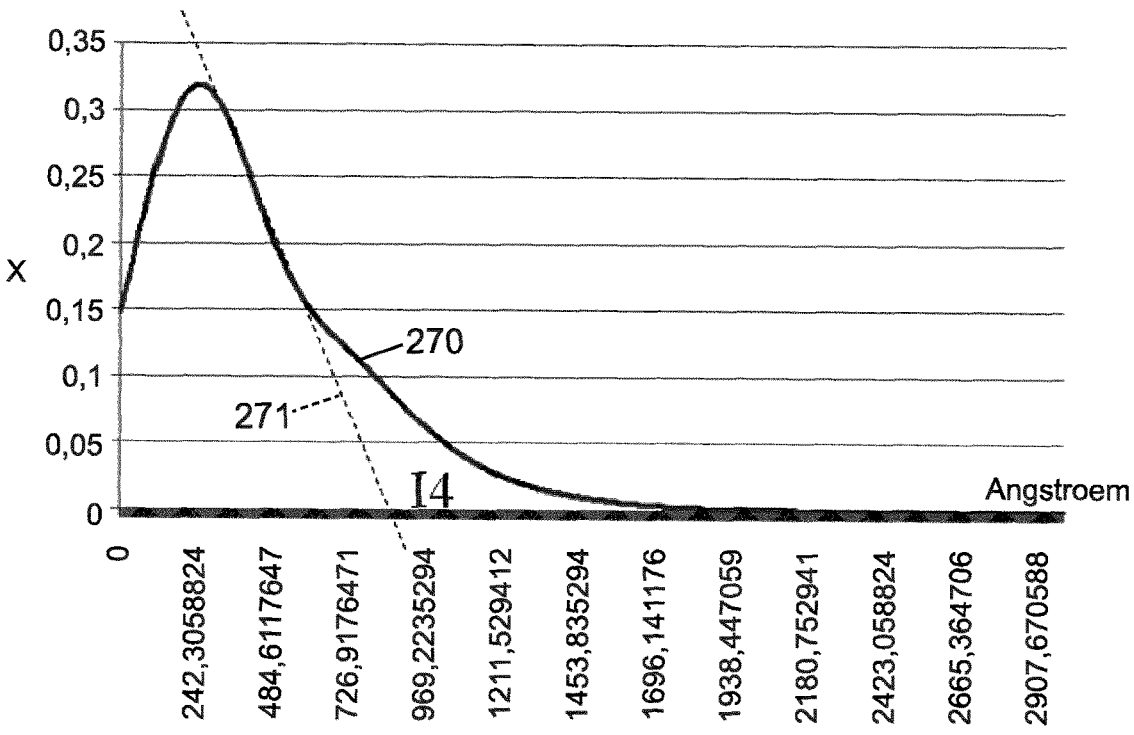

FIG. 27 represents the concentration profile (270) calculated for a dose of $1.5\times10^{17}$ ions/cm$^2$ accounting for a single- and multi-charged ion $O^+$, $O^{2+}$, $O^{3+}$ ion beam, subject to an acceleration voltage of 25 kV. The $O^+/O^{2+}/O^{3+}$ ion distribution is estimated to be equal to 58%/31%/11% with respective energies equal to 25 keV/50 keV/75 keV. Tangent 271 is represented. The point of intersection 14 is substantially situated around 85 nm.

Figure 28:
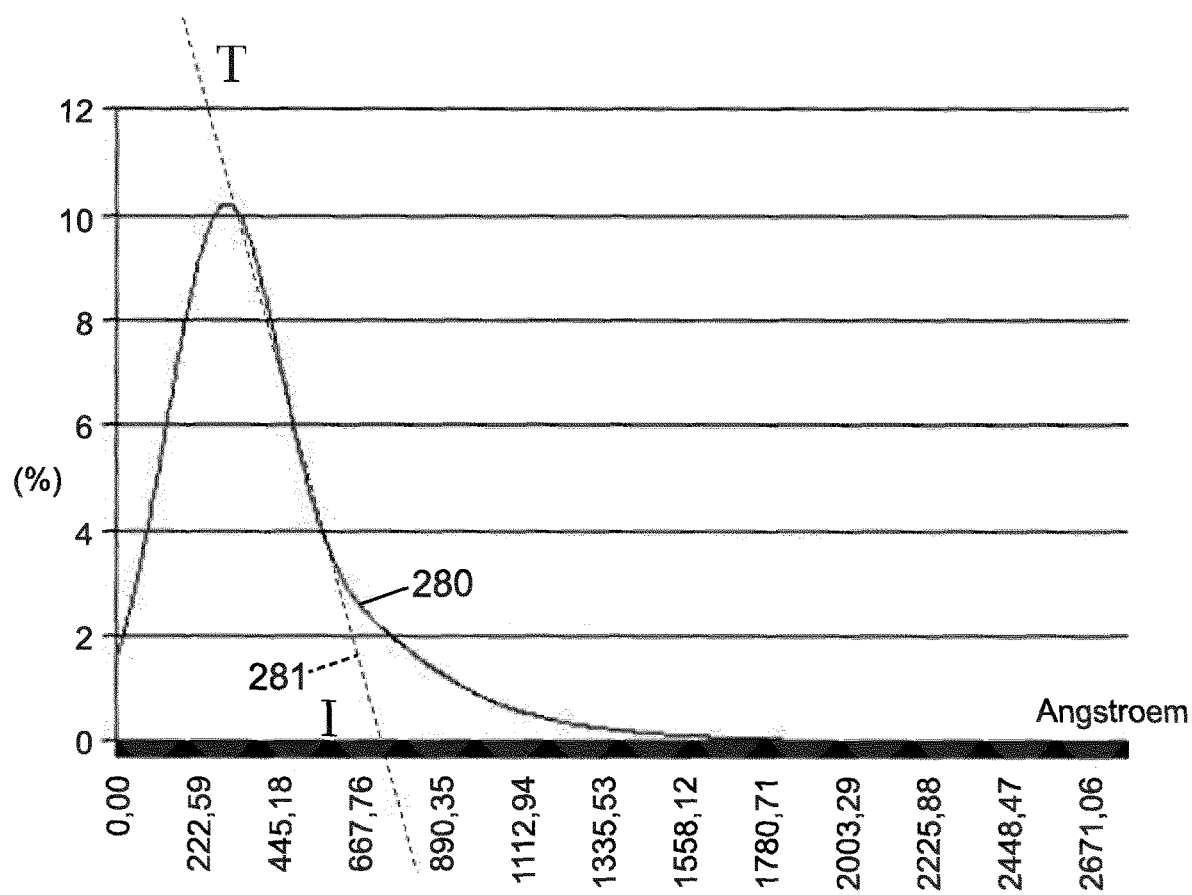

FIG. 28 represents the concentration profile (280) calculated for a dose of $5\times10^{16}$ ions/cm$^2$ accounting for a single- and multi-charged ion argon, $Ar^+$, $Ar^{2+}$, $Ar^{3+}$, ion beam, subject to an acceleration voltage of 35 kV. The $Ar^+/Ar^{2+}/Ar^{3+}$ ion distribution is estimated to be equal to 60%/30%/10% with respective energies equal to 35 keV/70 keV/105 keV. Tangent 281 is represented. The point of intersection I is substantially situated around 72 nm.

The choice of single- and multi-charged gas ions and the bombardment conditions of these single- and multi-charged gas ions according to the invention makes it possible to advantageously obtain a reduction in the refractive index of the sapphire material resulting in a reduction of the reflection coefficient and an increase in the transmission coefficient. These properties are very important for significantly enhancing the transmission, for example of a capacitive touch panel.

The inventors observed that the ranges chosen according to the acceleration voltage and the single- and multi-charged gas ion dose per unit of surface area make it possible to select experimental conditions wherein the reduction of glare (thus of the reflection coefficient) is possible by means of single- and multi-charged gas ion bombardment.

Furthermore, they observed that the invention makes it possible to increase, in certain cases, the surface toughness of the treated sapphire by observing the imprint left by a diamond at a given load on a reference sapphire and a treated sapphire. The imprint left on the treated sapphire has a lozenge shape with partially drawn contours whereas the imprint left on the reference sapphire exhibits on the entire periphery glare diffracting light. After treatment, the sapphire may have a superior surface toughness, in other words, a superior scratch resistance.

The choice of the single- and multi-charged gas ion dose per unit of surface area in the dose range according to the invention may result from a prior calibration step wherein a sample consisting of the envisaged sapphire material is bombarded with one of the single- or multi-charged gas ions, for example from He, Ne, Ar, Kr, Xe, $N_2$, $O_2$. This sapphire material may be bombarded in various zones of the material with a plurality of single- or multi-charged gas ion doses, within the range according to the invention. The treated zones are then observed so as to choose a suitable dose according to the more or less significant observation of glare on the treated surface at an angle 0° (perpendicular to the surface).

The observation of the treated zone may thus be carried out using simple observation techniques, such as an observation with the naked eye at an angle of incidence of 0° or 10° respectively from the actual observer or a reflected image (for example a wall close to the sample) or routine laboratory experimental techniques for quantitatively measuring the transmission profile associated with each wavelength of the visible spectrum between 400 and 800 nm.

Without seeking to be bound to any scientific theory, it may be inferred that this phenomenon in respect of the reduction of the refractive index of the implanted thickness may be explained by the creation and agglomeration of gaps, or the formation of nanocavities filled with gas with a refractive index very close to 1. Indeed, these single- and multi-charged gas ions may be dissolved in sapphire below a certain atomic concentration threshold (estimated as below 1%). Once the concentration threshold has been exceeded, nanocavities filled with gas appear to be formed, contributing to a reduction in the index of the implanted layer. It is also possible that the ion bombardment destroys the regular crystallographic order of sapphire (amorphisation), reducing the dielectric permittivity of the implanted layer which is correlated with the refractive index. It is also conceivable in the case of oxygen that oxygen doping favours the formation of sub oxides wherein the chemical formula is relatively close to that of alumina ($Al_2O_3$), written in the form $Al_2O_{3+x}$ where x is between 0 and 0.5 wherein the variability in terms of chemical and/or crystallographic composition makes it possible to form a very effective index gradient compared to the other types of ions, to attenuate the light reflection significantly.

The invention also relates to a capacitive touch panel having a transmission in the visible range for example greater than or equal to 90% or even equal to 97%, very superior to those of existing touch panels, and a scratch-proof contact surface (with the exception of any scratching caused by contact with a diamond). It comprises at least one or two sapphire substrates treated against glare by ion bombardment to significantly increase the light transmission from the display screen, to significantly reduce parasitic reflection of ambient light (particularly in outdoor environments) rendering reading of the display screen difficult or impossible, to consecutively and proportionally reduce the electrical consumption associated with the display, finally to significantly increase the battery life. The ion bombardment treatment used in the invention preserves the scratch-proof properties associated with sapphire, has no impact on the detection sensitivity of the capacitive touch panel and advantageously makes it possible to increase the mechanical resistance of the touch panel subject to touch-related flexural movements or shocks. The invention makes it possible to create a capacitive touch panel with no restriction in size, consisting of a connected assembly of elementary capacitive touch panels that cannot be visually differentiated.

It is noted that a touch screen is an electronic device combining two functions: displaying a screen (monitor) and those of a pointing device, which may be a mouse, a touch panel but also an optical stylus.

This makes it possible to reduce the number of devices on some systems and produce ergonomic software very suitable for certain functions. Touch screens are used, for example, for PDAs, GPS systems, MP3 players, smart phones, tablets, portable games consoles, ticket vending machines, ATMs, all self-service checkouts and computers.

The term touch panel denotes the part of the screen which may be sensitive to more than two pressure levels with a superior resolution (graphic tablet and stylus) and at more than one point at a time (multi-touch and fingers).

The detection of a pressure point on the touch panel is based on measuring the variation of a physical quantity.

Touch technologies are characterised by the various physical quantities measured and the acquisition methods for converting measurements into coordinates (x; y). The principles of the most common touch technologies are resistive, capacitive, and infrared in nature.

The term capacitive touch panel denotes a panel comprising at least one solid contact surface that may be made of glass, or made of sapphire, which is traversed under the contact surface, by an electrically charged grid. Contact of the user's fingers on the contact surface transfers a portion of these charges to the fingers, causing a loss that simply needs to be located in order to process the information.

Information processing is performed by means of a computing algorithm integrated directly in the device. It determines the impact point(s) (in the case of multi-touch), the direction of the movement, in some cases the pressure applied, and acts accordingly.

Existing capacitive touch panels have layered architectures which vary from each other but have the common properties of having a rigid contact surface (made of glass or sapphire) and an underlying electrical grid which may be presented in the form of a grid of electrical tracks XY situated in the same plane or a grid of electrical tracks X overlaid on a grid of electrical tracks Y in two separate planes. In both cases, the electrical tracks X and Y are separated and assembled by an insulating resin.

At the present time, 90% of touch panels are equipped with electrical tracks made of ITO (Indium Tin Oxide), a metal oxide having the following properties:
Transparency in visible light,
High optical index between 1.7 and 2 in visible light according to the wavelengths
Electrical conductivity restricted to:
100 ohm/square on polymers (flexible)
50 ohm/square on glass materials (rigid)
This restriction of the electrical conductivity has the direct impact of restricting the size of the capacitive touch panels to 12 inches (in other words about 30 cm)
ITO (Indium Tin Oxide) has the following essential drawbacks:
The energy cost thereof for depositing same at high temperatures,
The very high reflectivity thereof (forming an interface with air (n=1) or a glass (n=1.5))
The fragility thereof,
The low flexibility thereof,
The resistivity thereof which is acceptable but high compared to silver, copper.

Of the capacitive panel architectures with ITO (Indium Tin Oxide) grids fully laid on glass, mention may be made of:
Configuration 1: Glass (front face contact surface)/Grid X/Glass/adhesive/Grid Y/Glass (rear face)
Configuration 2: Contact glass (front face contact surface)/Grid XY/Glass (rear face)
Configuration 3: Contact glass (front face contact surface)/Grid X/Glass/Grid Y
Configuration 4: Contact glass (front face contact surface)/Grid X Y Of the capacitive panel architectures with ITO (Indium Tin Oxide) grids partially laid on glass and partially on polymer film, mention may be made of:
Configuration 5: Contact glass (front face contact surface)/Grid X/Glass/adhesive/Grid Y/polymer film (rear face)

Of the capacitive panel architectures with ITO (Indium Tin Oxide) grids fully laid on polymer film, mention may be made of:
Configuration 6: Glass (front face contact surface)/Grid X/Film/adhesive/Grid Y/Glass (rear face)
Configuration 7: Glass (front face contact surface)/Grid XY/Glass (rear face)
Configuration 8: Glass (front face contact surface)/Grid X/Glass/Grid Y
Configuration 9: Contact glass (front face contact surface)/Grid X Y Capacitive touch panels currently have optical restrictions inherent to the architecture and composition thereof. These optical restrictions are associated with the transmission and reflection of light from the display screen and that of the ambient environment, and the dimensions of the display screen. These restrictions relate to the complexity of the structure of the capacitive touch panel (number of interfaces inserted between the reader and the display screen) and the physical nature of the layers (grid resistivity, difference in refractive index of media separated by the various interfaces). The source of this type of optical restriction, the envisaged solutions and associated drawbacks are given hereinafter.

Multiplication of the number of interfaces inserted between the display screen and the reader is possible:

The light transmission from the display screen is attenuated when the number of interfaces to be passed through increases. Similarly, the reflectivity of the ambient light (particularly in outdoor environments) is increased when the number of interfaces increases. The combination of effects results in a degradation in the legibility of the display screen.

A solution consists of reducing the number of layers forming the capacitive touch panel at the expense of the mechanical resistance thereof.

Excessively high refractive index of electrical tracks of grids made of ITO in relation to that of the laying substrate thereof can be considered:

The reflection of light on an interface increases as the difference in refractive index between the media separated by the interface rises. This is the case for electrical tracks based on ITO (refractive index equal to 1.8) laid on a glass substrate (refractive index equal to 1.5). The loss of reflection of approximately 1% is not negligible and adds to the other reflection losses.

A solution consists of depositing an anti-glare treatment based on $TiO_2$ and $SiO_2$ between the glass substrate and the electrical tracks made of ITO, at the expense of the cost and durability of the electrical tracks made of ITO subject to touch-related flexural loads.

Insufficient conductivity of the electrical tracks made of ITO to enable the detection of an electrical signal beyond 30 inches can be considered:

A solution would consist of introducing highly conductive electrical tracks presented in the form of a low-density lattice (a volume comprising at least 90% void), having the advantage of facilitating the flow of light, in other words, the transmission thereof, by increasing the transparency of the medium. This approach has not yet met with success for industrialisation and cost issues. At the present time, 90% of grids are made from electrical tracks based on ITO.

Technological examples potentially succeeding ITO may include:

Metal grids consisting of 4 to 5 micron conductive tracks at 100 to 400 micron intervals. This type of grid only covers the substrate very partially (void fraction >90%).

Silver nanowire lattice (10 ohm/square; void fraction >94%).

Silver nanoparticle lattice (4 ohm/square; void fraction >95% void).

Carbon nanotube lattice.

In addition to the optical restrictions cited above, there is a second category of optical restrictions liable to arise at any time and relating to the use of the capacitive touch screen: scratch ability of contact surface, cracking of capacitive touch panel under the effect of a shock or flexion, finger marks. The source of this type of optical restriction, envisaged solutions and drawbacks associated therewith are given hereinafter.

Scratch ability of contact surface to be considered:

Glass surfaces are easily scratched by ambient abrasive particles liable to be deposited thereon before being moved by a finger. The scratches and debris created results in scattering both of the light transmitted by the display screen and the ambient light reflected by said contact surface. This scattering of light is added to the degradation of the reading of the image emitted by the display screen.

A solution consists of substituting glass surfaces with sapphire surfaces.

Sapphire is known for the extreme hardness thereof situated just below that of diamond, but involving the major drawbacks of the long and costly production thereof in furnaces heated to 2050° C. and that of the extremely high refractive index thereof (n=1.76), the direct effect whereof gives rise to high reflection in ambient light on the contact surface (15% reflection) and to considerable attenuation of the images from the display screen (85% transmission). To compensate for this, it is necessary to increase the light from the display, in other words, the electrical energy consumption. PVD type anti-glare coatings are very suitable as inner coatings of sapphire watch glasses, but are not suitable (due to the fragility thereof) as outer coatings exposed for example to wear from the back of a sleeve and even less suitable for wear due to touch.

Sensitivity to shocks and flexural loads to be considered:

High hardness is associated with a low shock resistance but a higher resistance to flexural loads (higher elasticity).

A solution consists of finding a compromise in the form of a hybrid surface consisting of a relatively hard surface wherein the surface has few or no crack tips embedded in a thickness of lower hardness.

Oil absorption to be considered: products for rendering surfaces oil-repellent exist, but involve the drawbacks of being expensive and non-durable.

An aim of the invention is that of remedying the limitations, drawbacks and technical problems described above.

According to an embodiment, the invention relates to a capacitive touch panel successively comprising the following connected parts (without any air layer):

a) a "front" face consisting of a rigid substrate made of sapphire wherein one of the sides forms the contact surface of the touch panel. This "front" face receives an ion bombardment treatment on only one side (that in contact with fingers) to reduce the reflectivity thereof. The ion bombardment is performed using an ion beam wherein the ions are chosen from atoms from the list consisting of helium (He), nitrogen (N), oxygen (O), neon (Ne), argon (Ar), krypton (Kr), xenon (Xe); hereinafter, the term "front" face of the capacitive touch panel denotes this sapphire layer wherein the rear face is the contact surface with the user's fingers. This layer is plane and has a thickness less than 1 mm, for example equal to 400 µm, or for example 330 µm.

b) A capacitive detection layer consisting of one or a plurality of layers, the function whereof is that of enabling the capacitive technology to detect contact of the finger(s) on the contact surface of the "front" face. These layers include the capacitive detection grids consisting of a set of electrical tracks, the insulating resins insulating and assembling the electrical tracks. These electrical tracks may be made of ITO (Indium Tin Oxide), a grid of highly conductive metal (electrical conductivity greater than that of aluminium), silver nanowires or nanoparticles, or carbon nanotubes. The insulating resins used have a refractive index similar to that of ITO (equal to approximately 1.8). Hereinafter, the term capacitive detection layer denotes the assembly of the layers mentioned above apart from the "front" face and "rear" face and situated in a connected manner (with no air layer) between the "front" face and the "rear" face described hereinafter.

c) a "rear" face consisting of a sapphire substrate treated by ion bombardment to reduce the reflectivity thereof, on the side facing the display screen, under identical conditions to those used to treat the "front" face. An advantageous anti-reflective effect is thus obtained, which considerably increases that obtained for the "front" face suitable for attaining light transmission from the display screen via the upper panel greater than 90% for example equal to 97%. This rear face has a reduced thickness preferably less than 400 µm for sapphire-related cost issues, for example equal to 100 µm.

The term anti-reflective treatment denotes a treatment for reducing light reflection, for example at least by one half. For an air/sapphire interface, the reflection is approximately 7.5%, the anti-reflective treatment makes it possible to reduce the value of this reflection to a value less than 3.75%. By way of example, the transmission of an air/sapphire interface is approximately equal to 92.5%, an anti-reflective treatment of the sapphire should, for example, enable a transmission at least equal to 96.25%. For a sapphire strip treated on both sides, this should result, for example, in a light transmission through said strip at least equal to 92.5% instead of 85%.

As demonstrated here above, it is thus possible by means of the ion bombardment anti-reflective treatment to create an index gradient between the air situated on the contact surface and the sapphire.

This index gradient is sustainable due to the high resistance thereof to abrasion processes: for example, the displacement of abrasive particles carried by the user's fingers on the contact surface.

The ion bombardment anti-reflective treatment is usually perfectly homogeneous due to the very high stability of the beam produced by the means used in the invention and the acuity in respect of the setting of the kinematic parameters associated with the treatment (speed, pitch). The setting may for example be as fine as needed to achieve for example at all points of the contact surface of the "front" face of the capacitive touch panel, a mean atomic concentration of implanted ions with a precision less than or equal to (+/−) 5% in relation to that required. Due to the small thickness thereof (approximately 80 nm) and the perfect homogeneity thereof, the treatment has no impact on the sensitivity of the underlying capacitive detection layer.

According to an embodiment, the invention relates to a capacitive touch panel comprising a plurality of capacitive touch panels made of sapphire material(s) previously treated on the rear and front faces thereof and on the side faces thereof, and then assembled together to produce a perfectly plane and not showing any separation there between (adjacent anti-reflective faces), to the naked eye and to the touch. Unlike glass materials, sapphire has physical properties rendering sapphire extremely temperature-stable (no glass transition), giving same evenness and extremely precise crystallographic cutting planes. The crystallographic characteristics of sapphire materials are perfectly controlled during the growth of the sapphire material in the furnace.

By means of a capacitive touch panel according to the present invention, the legibility of the display screen may be enhanced considerably by a reduction in the reflection of ambient light and by a significant increase in the light transmission from the display screen greater than or equal to 90% for example equal to 97%.

By means of a capacitive touch panel according to the present invention, the electrical consumption of the display screen may be reduced significantly at least by 15% or even 30%, in proportion to the increases in brightness and contrast obtained by enhancing the light transmission from the display screen and by attenuating the reflection of ambient light thereon.

By means of a capacitive touch panel according to the present invention, the battery life may be increased considerably due to the significant reduction in the electrical consumption of the display screen.

By means of a capacitive touch panel according to the present invention, the contact surface may be highly scratch-proof retaining the optical qualities mentioned above in the long term.

By means of a capacitive touch panel according to the present invention, the mechanical strength of the front face may be increased in relation to shocks and flexural loads retaining the optical qualities mentioned above in the long term.

By means of a capacitive touch panel according to the present invention, finger marks may be reduced significantly retaining the optical qualities mentioned above in the long term.

By means of a capacitive touch panel according to the present invention, it is possible to envisage a capacitive panel of a large size without any restriction of the surface area, consisting of an edge-to-edge assembly of a multitude of elementary capacitive touch panels comprising sapphire materials treated against glare by ion bombardment on the rear and/or front sides and on the lateral sides, not showing any separation there between to the naked eye and to the touch.

According to an embodiment, the ion bombardment anti-reflective treatment of the sapphire material used in the present invention does not require long treatment times (a few seconds per $cm^2$ and per micro-accelerator).

The anti-reflective treatment of the sapphire material used in the present invention may enable the use thereof in an industrial context, where the cost thereof should not be redhibitory in relation to the costs of the sapphire substrate (for example one $cm^2$ of sapphire for touch panels costs approximately 4 Euro, one $cm^2$ treated within the scope of the invention costs a few cents).

According to one embodiment of the present invention, the capacitive touch panel comprises a "front" face made of sapphire treated on the front side (contact surface) by ion bombardment to give same anti-reflective properties and a capacitive touch detection layer containing electrical tracks made of ITO (Indium Tin Oxide) or electrical tracks made of a highly conductive metal (electrical conductivity greater than that of pure aluminium), silver nanowires, silver nanoparticles, or carbon nanotubes presented in the form of a low-density lattice (volume comprising at least 90% void), the electrical tracks being electrically insulated and assembled with insulating resins wherein the refractive index is preferably greater than or equal to 1.6, preferably similar to that of sapphire (equal to 1.76) or ITO (equal to 1.8).

According to one embodiment of the present invention, the capacitive touch panel comprises a "front" face made of sapphire treated on the front side (contact surface) by ion bombardment to give same anti-reflective properties, a capacitive detection layer containing electrical tracks made of ITO (Indium Tin Oxide) or electrical tracks made of a highly conductive metal (conductivity greater than that of pure copper), silver nanowires, silver nanoparticles, or carbon nanotubes presented in the form of a low-density lattice (volume comprising at least 90% void), the electrical tracks being electrically insulated and assembled with insulating resins wherein the refractive index is preferably greater than or equal to 1.6, preferably similar to that of sapphire (equal to 1.76) or ITO (equal to 1.8) and a "rear" face made of sapphire wherein the front is subjected to an identical anti-reflective treatment to that used on the front side of the "front" face. The rear face has preferably a reduced thickness less than 400 microns for sapphire-related cost issues, for example 100 microns.

Figure 29:
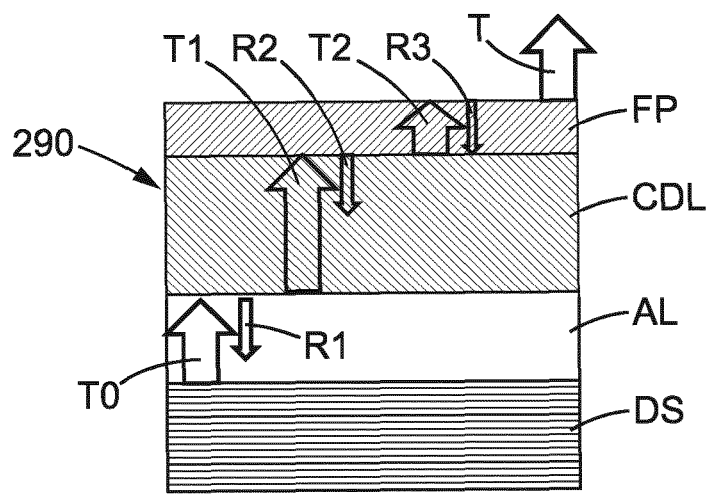
FIGS. 29 and 30 are sketches of capacitive touch panels according to prior art.
Figure 30:
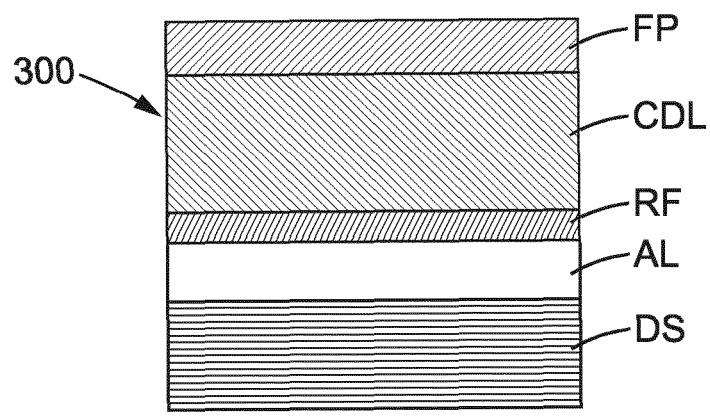
Figure 31:
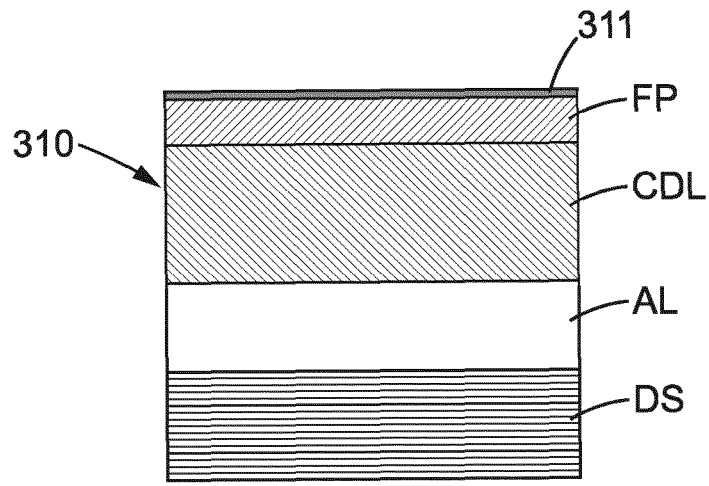
FIGS. 31 to 33 are sketches of capacitive touch panels according to the present invention.
Figure 32:
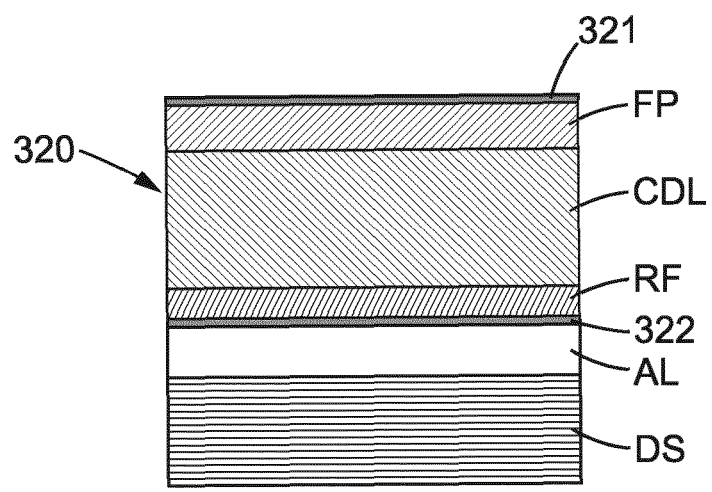
Figure 33:
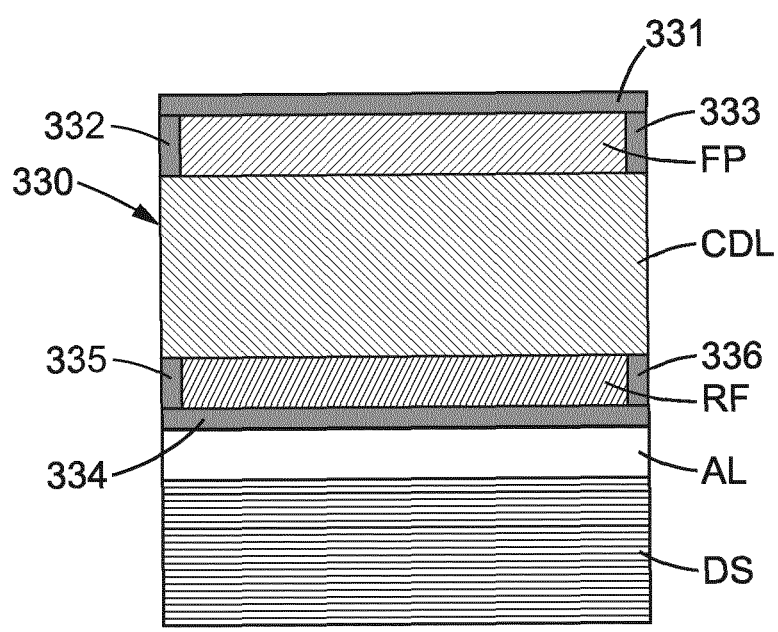

Examples of embodiments of capacitive touch panels according to the present invention are shown in FIGS. 31 to 33, whereas FIGS. 29 and 30 are examples of embodiments of capacitive touch panels according to prior art.

In FIGS. 29 to 33, the same references are used to designate the same parts of a capacitive touch panel, where:
FP refers to a "front panel";
CDL refers to a (or a plurality of) "capacitive detection layer(s)";
RF refers to a "rear face", that can also be called a "rear panel";
AL refers to an "air layer";
DS refers to a "display screen".

A capacitive touch panel, according to the embodiments illustrated in FIGS. 29 to 33, comprises a front panel, FP; capacitive detection layers, CDL; and a display screen, DS, separated from the capacitive touch detection layers, CDL, by an air layer, AL. The capacitive touch detection layers, CDL, form a compact assembly (grid+insulating resin) and are connected to the front panel, FP (without any air layer possibly separating same).

The front panel, FP, of a capacitive touch panel is usually made of glass; it can also be made of a sapphire material; a front panel, FP, of a capacitive touch panel according to the present invention is made of a sapphire material. The capacitive touch detection layers are usually made of highly conductive metal (conductivity greater than or equal to that of aluminium), silver nanowires or nanoparticles, or carbon nanotubes form a low-density lattice (volume comprising 90% void) insulated with an insulating resin with a refractive index greater than or equal to 1.6 preferably comparable to that of the resin used for ITO tracks (refractive index equal to about 1.8).

The capacitive touch detection layers have a different refractive index to the face according to the circumstances: the capacitive touch detection layers have usually a refractive index close to 1.8 (corresponding to that of ITO and insulating resin thereof), the front face has an index close to 1.51 if it is made of glass or close to 1.76 if it is made of sapphire.

FIG. 29 is an illustration of a prior art capacitive touch panel 290 where principles of light reflection and transmission are shown. One can see the changes in the transmission of light, T0, emitted by the display screen, DS, and directed towards the ambient air (outside the front panel, FP, according to arrow T). The reflection-induced losses include those associated with:

a first light reflection, R1, of the light emitted, T0, on the interface situated at the interface of the air layer, AL, and the capacitive touch detection layers, CDL;

a second light reflection, R2, of the light transmitted, T1, between the capacitive touch detection layers, CDL, and the front panel, FP;

a third light reflection, R3, of the light transmitted, T2, between the front panel, FP, and the ambient air (outside the front panel, FP, according to arrow T).

The light reflection and transmission have associated coefficients in respect of reflection R and transmission T wherein the values are between 0 and 1 and suitable for being calculated based on the formulas hereinafter.

The decrease in the transmission of light emitted by the display corresponds to the aggregation of the reflections taking place successively at the various interfaces of the capacitive touch panel:

$$T = T0 - (R1 + R2 + R3), \text{ where:}$$

The refraction increases as the difference in refractive index between the two media n1, n2 separated by the interface increases. The reflection and transmission coefficients may be calculated using the following formulas (known as Fresnel formulas):

$$R = ((n1 - n2)/(n1 + n2))^2;$$

$$T = (2n1 \times n2/(n1 + n2))^2;$$

Where $R + T = 1$.

In following examples and calculations, one considers that parts referred as capacitive detection layers (CDL), air layer (AL) and display screen (DS) are of the same type and have similar features.

Following table shows the light reflection coefficient values on passing through the various interfaces forming the capacitive touch panel described in FIG. 29 when the front panel is made of glass (refractive index equal to 1.51) and the capacitive detection layers comprise electrical tracks made of ITO (refractive index equal to 1.8) insulated by a resin having a practically comparable refractive index or by means of a highly conductive electrical track lattice (electrical conductivity greater than or equal to that of pure aluminium) having a low density (volume including at least 90% void) insulated by a resin having a comparable refractive index to that of the resin used for ITO (refractive index 1.8). The first column gives the interfaces D concerned by the calculation, the second and third column (n1) and (n2) give the refractive indexes n1 and n2 of the media separated by the interface, the fourth column (R) contains the reflection coefficients expressed as a %, calculated using Fresnel formulas. Opposite the cell containing RT(%) features the total sum of the light reflection coefficients through the capacitive touch panel i.e. a 13% loss corresponding to 87% light transmission.

Detailed results are following:

| D | n1 | n2 | R % |
|---|---|---|---|
| A/FP | 1 | 1.5 | 4.1 |
| FP/CDL | 1.5 | 1.8 | 0.7 |
| CDL/AL | 1.8 | 1 | 8.1 |
| | | RT (%) | 13.0 |

Following table shows the light reflection coefficient values on passing through the various interfaces described in FIG. 29 when the front panel is made of sapphire (refractive index equal to 1.76) and the capacitive detection layers comprise electrical tracks made of ITO (refractive index equal to 1.8) insulated and assembled by a resin having a practically identical index or by means of a highly conductive electrical track lattice (electrical conductivity greater than or equal to that of pure aluminium) having a low density (volume including at least 90% void) insulated and assembled by a resin having a practically comparable refractive index to that of the resin used for ITO (refractive index 1.8). Opposite the cell containing RT(%) features the total sum of the light reflection coefficients through the capacitive touch panel i.e. a 15.75% loss corresponding to 84.25% light transmission.

Detailed results are following:

| D | n1 | n2 | R % |
|---|---|---|---|
| A/FP | 1 | 1.7 | 7.5 |
| FP/CDL | 1.7 | 1.8 | 0.0 |
| CDL/AL | 1.8 | 1 | 8.1 |
| | | RT (%) | 15.7 |

Following table shows the light reflection coefficient values on passing through the various interfaces forming the capacitive touch panel described in FIG. 30. Said prior art capacitive touch panel 300 comprises both a front panel FP and a rear face RF. When the front panel and rear face are made of glass (refractive index equal to 1.51) and the capacitive detection layers comprise electrical tracks made of ITO (refractive index equal to 1.8) insulated by a resin having a practically identical index or by means of a highly conductive electrical track lattice (conductivity greater than or equal to that of pure aluminium) having a low density (volume including at least 90% void) insulated by a resin having a comparable refractive index to that of the resin used for ITO (refractive index equal to 1.8). The first column gives the interfaces D concerned by the calculation, the second and third column (n1) and (n2) give the refractive indexes n1 and n2 of the media separated by the interface, the fourth column (R) contains the reflection coefficients expressed as a %, calculated using Fresnel formulas. Opposite the cell containing RT(%) features the total sum of the light reflection coefficients through the capacitive touch panel. This sum corresponds to a reflection-induced loss equal to 9.79% corresponding to a light transmission equal to 90.21%. Said table contains the most routine and most optimal scenario with respect to "conventional" glass-based capacitive touch panel technology (known prior art). These figures are used as standard reference of the current market, in order to highlight the gains obtained for the various embodiments of the invention detailed hereinafter.

Detailed results are following:

| D     | n1  | n2  | R %  |
|-------|-----|-----|------|
| A/FP  | 1   | 1.5 | 4.1  |
| FP/CDL| 1.5 | 1.8 | 0.7  |
| CDL/RF| 1.8 | 1.5 | 0.7  |
| RF/AL | 1.5 | 1   | 4.1  |
|       |     | RT (%) | 9.8 |

Following table shows the light reflection coefficient values on passing through the various interfaces described in FIG. 30 when the front panel FP and a rear face RF are made of sapphire (refractive index equal to 1.76) and the capacitive detection layers comprise electrical tracks made of ITO (refractive index equal to 1.8) insulated by a resin having a practically identical index or by means of a highly conductive electrical track lattice (conductivity greater than or equal to that of pure aluminium) having a low density (volume including at least 90% void) insulated by a resin having a comparable refractive index to that of the resin used for ITO (refractive index equal to 1.8). Opposite the cell containing RT(%) features the total sum of the reflections applied to the light passing through the capacitive touch panel i.e. a 15.19% loss corresponding to 85.81% light transmission. The transmission coefficient of the architecture comprising a single front face made of sapphire described in FIG. 29 is barely exceeded. This is unsurprising in that the refractive index of sapphire, which is relatively close to that of ITO is still well above that of the air layer separating the display screen from the "rear" face. Detailed results are following:

| D     | n1  | n2  | R %  |
|-------|-----|-----|------|
| A/FP  | 1   | 1.7 | 7.5  |
| FP/CDL| 1.7 | 1.8 | 0.0  |
| CDL/RF| 1.8 | 1.7 | 0.0  |
| RF/AL | 1.7 | 1   | 7.5  |
|       |     | RT (%) | 15.1 |

Following tables show the light reflection coefficient values on passing through the various interfaces described in FIG. 31 of a capacitive touch panel 310, according to an embodiment of the present invention. The front panel FP made of sapphire (refractive index equal to 1.76) is provided with an anti-glare treatment layer 311 made according to the method of the present invention. According to a first and second embodiments, the effect of the anti-glare treatment layer respectively reduces the reflection of light by 50% to change from a reflection coefficient of 7.5% to 3.75% (referred as 311(50%)) and by 80% to change from a reflection coefficient of 7.5% to 1.5% (referred as 311(80%)) at the interface A/FP, on the assumption that the capacitive touch detection layers comprise electrical tracks made of ITO (refractive index equal to 1.8) insulated by a resin having a substantially comparable refractive index or by means of a highly conductive electrical track lattice (conductivity greater than or equal to that of aluminium) and having a low density (volume including at least 90% void) insulated by a resin having a comparable refractive index to that of the resin used for ITO (refractive index equal to 1.8). Opposite the cell containing RT(%) features the total sum of the coefficients of the reflections applied to the light passing through the capacitive touch panel. The loss RT(%) is equal to 11.92% corresponding to a light transmission of 88.08% for 311(50%); the loss RT(%) is equal to 9.68% corresponding to a light transmission of 90.32% for 311(80%). It is observed that 311(50%) is equivalent to a layer having a mean refractive index equal to 1.48 to obtain a 50% reduction of the reflection coefficient between air and sapphire to change from 7.5% to 3.75%; it is observed that 311(80%) is equivalent to a layer having a mean refractive index equal to 1.28 to obtain an 80% reduction of the reflection coefficient between air and sapphire to change from 7.5% to 1.5%; in the latter case, the refractive index is close to that corresponding to the square root of the product of the refractive indices of air and sapphire, equal to $(1 \times 1.76)^{1/2} = 1.32$. With an AR (80%), this embodiment of the invention has comparable optical qualities in transmission to those obtained with a "conventional" capacitive touch panel using glass materials at the front panel and rear face (transmission of 90.32% for the first, 90.21% for the second) having the indisputable advantage of the scratch-proof nature of the contact surface associated with an increase in the mechanical resistance to shocks and to flexural loads.

Detailed results are following, where first table refers to a reduction of the reflection of light of the anti-glare treatment layer by 50% (first here above embodiment) and second one refers to a reduction of the reflection of light by 80% (second here above embodiment):

| D                | n1  | n2  | R %  |
|------------------|-----|-----|------|
| A/(FP + (311(50%)))| 1   | 1.4 | 3.7  |
| FP/CDL           | 1.7 | 1.8 | 0.0  |
| CDL/AL           | 1.8 | 1   | 8.1  |
|                  |     | RT (%) | 11.9 |
| A/(FP + (311(80%)))| 1   | 1.2 | 1.5  |
| FP/CDL           | 1.7 | 1.8 | 0.0  |
| CDL/AL           | 1.8 | 1   | 8.1  |
|                  |     | RT (%) | 9.6 |

Following tables show the light reflection coefficient values on passing through the various interfaces described in FIG. 32 of a capacitive touch panel 320, according to an embodiment of the present invention. The front panel FP made of sapphire (refractive index equal to 1.76) is provided with an anti-glare treatment layer 321; said capacitive touch panel 320 also comprises a rear face RF also made of sapphire which is provided with an anti-glare treatment layer 322.

According to a first and a second embodiments, the anti-glare treatment layers (321) and (322) have the effect of reducing the reflection of light by 50% to change from a reflection coefficient of 7.5% to 3.75% (referred as 321 (50%)) and by 80% to change from a reflection coefficient of 7.5% to 1.5% (referred as 321(80%)), at the interfaces air A/(FP+321) and (RF+322)/AL, on the assumption that the capacitive touch detection layers comprise electrical tracks made of ITO (refractive index equal to 1.8) insulated by a resin having a substantially comparable refractive index or by means of a highly conductive electrical track lattice (conductivity greater than or equal to that of pure aluminium) and having a low density (volume including a void fraction greater than or equal to 90%) insulated by a resin having a comparable refractive index to that of the resin used for ITO (refractive index equal to 1.8). Opposite the cell containing RT(%) features the total sum of the reflections applied to the light passing through the capacitive touch panel. The loss RT(%) is equal to 7.51% corresponding to a light transmission of 92.49% for 321(50%) and 322(50%); the loss RT(%) is equal to 3.04% corresponding to a light transmission of 96.96% for 321(80%) and 322(80%). It is observed that for 321(50%) and 322(50%), the transmission which is equal to 92.49%, exceeds the transmission equal to 90.21% of "conventional" capacitive touch panels using glass materials as "front" faces, having the indisputable advantage of the scratch-proof nature of the contact surface associated with an increase in the mechanical resistance to shocks and to flexural loads. These optical and mechanical advantages are considerably increased for 321(80%) and 322(80%) for which the transmission is practically equal to 97% very greatly exceeding the transmission equal to 90.21% of "conventional" capacitive touch panels using glass materials as front panel and rear face, with additionally, here again, an advantage of indisputable superiority, in respect of the scratch-proof nature of the contact surface associated with an increase with the mechanical resistance thereof to shocks and flexural loads. In terms of energy, it is considered that for 321(50%), 321(50%), the energy consumption of the display screen may be reduced approximately by 15% (increase in light transmission from the display screen by 7.5% and reduction of reflection of ambient light by 7.5%); for 321(80%), 321(80%), the energy consumption of the display screen may be reduced approximately by 24% (increase in light transmission from the display screen by 12% and reduction of reflection of ambient light by 12%). The battery life may thus be increased significantly. Detailed results are following, where first table refers to a reduction of the reflection of light of the anti-glare treatment layer by 50% (first here above embodiment) and second one refers to a reduction of the reflection of light by 80% (second here above embodiment):

| D | n1 | n2 | R % |
|---|---|---|---|
| A/(FP + 321(50%)) | 1 | 1.4 | 3.7 |
| FP/CDL | 1.7 | 1.8 | 0.0 |
| CDL/RF | 1.8 | 1.7 | 0.0 |
| (RF + 322(50%))/AL | 1.4 | 1 | 3.7 |
| | | RT (%) | 7.5 |
| A/(FP + 321(80%)) | 1 | 1.2 | 1.5 |
| FP/CDL | 1.8 | 1.8 | 0.0 |
| CDL/RF | 1.8 | 1.7 | 0.0 |
| (RF + 322(80%))/AL | 1.2 | 1 | 1.5 |
| | | RT (%) | 3.0 |

FIG. 33 shows a capacitive touch panel 330, according to an embodiment of the present invention. The front panel FP made of sapphire (refractive index equal to 1.76) is provided with an anti-glare treatment layer 331; said capacitive touch panel 330 also comprises a rear face RF also made of sapphire which is provided with an anti-glare treatment layer 332. In this embodiment, the lateral sides 332, 333 of the front panel FP, and the lateral sides 335, 336 of the rear face RF are also provided with anti-glare treatment layer. Anti-glare treatment layers have been obtained thanks to the method of the present invention.

By means of the anti-glare treatment applied in this way, the light emitted by the display screen DS may pass through the air layer AL, the capacitive touch detection layer CDL, the front panel FP face 331, the lateral sides 332, 333 of the front panel FP, the rear face RF face 334, the lateral sides 335, 336 of the rear face RF with an extremely reduced reflection rate giving a visual impression of continuity to the assembly of elementary capacitive touch panels. According to an embodiment, anti-glare treatment of the different faces is identical.

Finally, to be able to exceed the size restrictions of capacitive panels, the inventors recommend assembling elementary capacitive touch panels comprising sapphire materials treated against glare by ion bombardment according to the method of the present invention, not only on the front or back sides but also on the lateral sides. Once assembled, the lateral sides of the sapphire materials become transparent to the naked eye, thus giving the impression of a single large-sized capacitive panel. The ion bombardment anti-glare treatments may be used under identical conditions for the front or back sides and the lateral sides.

The inventors have furthermore compiled in the comparative table below the transmission values obtained for a plurality of capacitive touch panels "architectures". Said capacitive touch panels may comprise glass and/or sapphire material front panel and/or rear face. Capacitive touch panels according to the present invention comprise sapphire material front panel and/or rear face; at least one of their sapphire material face(s) has been anti-glare treated according to the method of the present invention; such an anti-glare treated sapphire material is referred as "T_Sapphire" (for "treated sapphire material according to the method of present invention") in following table. Transmission values are indicated for a wavelength of 560 nm. The capacitive touch detection layer CDL comprises ITO parts. DS relates to the display screen.

| Capacitive touch panel Architecture | Transmission (%) | Reflection (%) |
|---|---|---|
| T_Sapphire/CDL/T_Sapphire/Air/DS | 97% | 3.00% |
| Glass/CDL/Glass/DS | 95.88 | 4.12% |
| T_Sapphire/CDL/Air/DS | 90.32% | 9.68% |
| Glass/CDL/Glass/Air/DS | 90.21% | 9.79% |
| Glass/CDL/Air/DS | 86.95 | 13.05% |
| Sapphire/ICDL/Sapphire/VAir/DS | 84.81 | 15.19% |
| Sapphire/CDL/Air/Ds | 84.25% | 15.75% |

It can be noted using the comparative here above table that the capacitive touch panels according to the present invention have a light transmission greater than 90% at 560 nm for a single treatment (T_Sapphire/CDL/Air/DS) or equal to 97% to 560 nm (T_Sapphire/CDL/T_Sapphire/Air/DS) for a double treatment and have the considerable advantage of being scratch-proof, resistant to shocks, and to flexural loads, in other words, of being capable of retaining this high transmission quality in the long term. Glass/CDL/Glass/DS technology consists of removing the air layer between the rear face made of glass and the display screen by bonding the display screen to the glass. This known technology makes it possible at best to achieve 95% but involves the drawback of having a contact surface made of scratchable glass, not allowing in the event of cracking the replacement of the touch panel alone (the display screen rigidly connected to the touch panel is replaced at the same time); finally, it does not exceed the high transmission obtained by the invention.

Thanks to the present invention, one can obtain a part made of sapphire material comprising at least one surface with implanted ions, wherein the reflection of an incident wave in the visible range is reduced at least by one third, as for example by one half, when compared to the reflection of an incident wave in the visible range on the untreated sapphire material, such as for example a wavelength of the incident wave of 560 nm.

Thanks to the present invention, one can obtain a synthetic sapphire material comprising at least one surface with implanted ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), wherein the reflection of an incident wave in the visible range on said surface is equal or less to 2%, as for example equal or less to 1%, when measured at a 560 nm wavelength.

The treatment method of the present invention can be used for treating a solid part made of sapphire material chosen for example from, but not limited to, the list consisting of a screen, such as for example a touch screen, a window, a watch glass, a light emitting device (LED) part, a lighting device part, an optical component, such as for example device lens.

The invention has been described above with the aid of embodiments without limitation of the general inventive concept; in particular the parameters are not limited to the examples discussed.

The invention claimed is:

1. A treatment method of a sapphire material to obtain an anti-glare treatment in the visible light range, said method comprising bombardment of a surface of the sapphire material by a single- and multi-charged gas ion beam so as to produce an ion implanted layer in the sapphire material, said surface having the ion implanted layer to be employed so as to interface with air, wherein:

a dose of implanted single- and multi-charged gas ions per unit of surface area provided by the ion beam is chosen in a range between $10^{12}$ ions/cm$^2$ and $10^{18}$ ions/cm$^2$; and, the bombardment being performed at a single acceleration voltage of the ion beam selected in a range between 5 kV and 1000 kV;
  and,
  wherein the ions of the single- and multi-charged gas ions are selected from ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S),
  the dose of the implanted single- and multi-charged gas ions per unit of the surface area is chosen so as to obtain an atomic concentration of ions in the implanted layer such that a refractive index (nL) of the implanted layer is approximately equal to
  $(nA \times nS)^{1/2}$, when the surface with the implanted layer air is interfacing with the air,
  where nA is a refractive index of air in the visible light range and nS is a refractive index of sapphire material in the visible light range;
  the acceleration voltage is chosen so as to obtain an ion implanted layer thickness (e) such that: $0.75\ p\lambda/(4\ nL) \leq e \leq 1.25\ p\lambda/(4\ nL)$
  where:

e is the ion implanted layer thickness at an ion implantation zone where the atomic concentration of the implanted single- and multi-charged gas ions is greater than or equal to 1% and wherein e is expressed in nanometer;
  p is a non nil positive integer;
  $\lambda$ is an incident wavelength of the visible light range, wherein $\lambda$ is expressed in nanometer; and,
  nL is the refractive index of the ion implanted layer,
  wherein the treatment method obtains the anti-glare treatment at least for an incident wave having the incident wavelength ($\lambda$) in the visible light range while increasing transmittance in the visible light range.

2. The treatment method of claim 1, wherein the ion beam comprises 10% multi-charged ions or more than 10% multi-charged ions.

3. The treatment method of claim 1, wherein the acceleration voltage is chosen to obtain a value of the implanted layer thickness between 75p and 125p, expressed in nm, where $(\lambda/4\ nL)=100$.

4. The treatment method of claim 1, wherein the dose of implanted single- and multi-charged gas ions per unit of surface area is chosen to obtain a value of the atomic concentration of the ions in the implanted layer of greater or equal to 5% and equal or less than 20%.

5. The treatment method of claim 1, wherein the dose of the implanted single- and multi-charged gas ions per unit of surface area is chosen in a range between $10^{16}$ ions/cm$^2$ and $10^{18}$ ions/cm$^2$.

6. The treatment method of claim 1, wherein the acceleration voltage is chosen in a range between 10 kV and 100 kV.

7. The treatment method of claim 1 wherein the dose of the implanted single- and multi-charged gas ions and the acceleration voltage are further chosen using data gathered in a step prior to bombardment by the single- and multi-charged gas ion beam of the sapphire material to be treated, wherein:

said step consists of choosing an experimental ion beam having one type of single- and multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S), performing a plurality of experiments with an experimental sapphire material similar to the sapphire material to be treated by bombarding the experimental sapphire material using said experimental ion beam and varying an experimental dose of the implanted single- and multi-charged gas ions per unit of surface area provided by the experimental ion beam and an experimental acceleration voltage of the experimental ion beam until determining a desired implanted single- and multi-charged gas ion dose per unit of surface area range and a desired acceleration voltage range so as to produce the anti-glare treatment in the visible light range;
  wherein the gas ion beam uses the one type of single- and multi-charged ions chosen for the experimental ion beam, wherein the dose of the implanted single- and multi-charged gas ions per unit of the surface area is chosen to be within the desired implanted single- and multi-charged gas ion dose per unit of surface area range and the acceleration voltage is chosen to be within the desired acceleration voltage range.

8. The treatment method of claim 1 wherein the dose of the implanted single- and multi-charged gas ions and the acceleration voltage are further chosen by:

choosing the ion beam to be one type of the single- and multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S);

choosing the dose of the implanted single- and multi-charged gas ions per unit of surface area of the ion beam and the acceleration voltage value of the ion beam according to a calculation based on an ion implantation profile according to an implantation depth for the implanted single- and multi-charged ions of the ion beam, where said ion implantation profile has been previously calculated or determined for a plurality of experimental acceleration voltages so as to produce the implanted ion layer to obtain a desired anti-glare treatment in the visible light range, so as to obtain a value of the atomic concentration of the ions in the implanted layer of greater or equal to 5% and equal or less than 20%.

9. The treatment method of claim 1 wherein the dose of the implanted single- and multi-charged gas ions and the acceleration voltage are further chosen by:

choosing the ion beam to be one type of single- and multi-charged ions of the elements from the list consisting of helium (He), neon (Ne), argon (Ar), krypton (Kr), xenon (Xe), boron (B), carbon (C), nitrogen (N), oxygen (O), fluorine (F), silicon (Si), phosphorus (P) and sulphur (S);

choosing the dose of the single- and multi-charged gas ions per unit of surface area and the acceleration voltage according to following equation:

$$0.02 \leq DC^2/(T\Delta n) \leq 2; \text{ wherein:}$$

D is a single- and multi-charged gas ion dose per unit of surface area value to be chosen, expressed in $10^{16}$ ions/cm$^2$;

C=M/15, where M is the atomic mass of the chosen one type of single and multi-charged ions, T is an acceleration voltage to be chosen, expressed in kV;

$\Delta n$ is the refractive index difference between the refractive index, nS in the visible light range, of the sapphire material to be treated and the refractive index, the nA in the visible light range of the air interfacing with the surface.

10. The treatment method of claim 9 wherein $DC^2/(T\Delta n)$ is greater or equal to 0.1 and/or equal or less than 1.

* * * * *